(12) United States Patent
Shelby

(10) Patent No.: US 11,356,200 B2
(45) Date of Patent: Jun. 7, 2022

(54) ENHANCED POLARIZATION WEIGHTING TO ENABLE SCALABILITY IN POLAR CODE BIT DISTRIBUTION

(71) Applicant: Coherent Logix, Incorporated, Austin, TX (US)

(72) Inventor: Kevin A. Shelby, Austin, TX (US)

(73) Assignee: Coherent Logix, Incorporated, Austin, TX (US)

( * ) Notice: Subject to any disclaimer, the term of this patent is extended or adjusted under 35 U.S.C. 154(b) by 0 days.

(21) Appl. No.: 17/345,380

(22) Filed: Jun. 11, 2021

(65) Prior Publication Data
US 2021/0306096 A1  Sep. 30, 2021

Related U.S. Application Data

(63) Continuation of application No. 16/737,021, filed on Jan. 8, 2020, now Pat. No. 11,063,697, which is a
(Continued)

(51) Int. Cl.
*H04L 1/00* (2006.01)
*H03M 13/13* (2006.01)
*H03M 13/03* (2006.01)

(52) U.S. Cl.
CPC ........ *H04L 1/0058* (2013.01); *H03M 13/033* (2013.01); *H03M 13/13* (2013.01);
(Continued)

(58) Field of Classification Search
CPC ... H04L 1/0058; H04L 1/0041; H04L 1/0057; H04L 1/007; H04L 1/00; H03M 13/033; H03M 13/13
(Continued)

(56) References Cited

U.S. PATENT DOCUMENTS

| 8,397,109 B2 | 3/2013 | Myung et al. |
| 10,243,592 B2 * | 3/2019 | Li .................... H03M 13/616 |

(Continued)

FOREIGN PATENT DOCUMENTS

| EP | 2899911 A1 | 7/2015 |
| EP | 3079290 A1 | 10/2016 |
| EP | 3119020 A1 | 1/2017 |

OTHER PUBLICATIONS

Huawei, HiSilicon; "Construction schemes for polar codes"; R1-1701702; 3GPP TSG RAN WG1 Meeting #88; Athens, Greece: Feb. 13-17, 2017; seven pages.
(Continued)

*Primary Examiner* — John J Tabone, Jr.
(74) *Attorney, Agent, or Firm* — Kowert, Hood, Munyon, Rankin & Goetzel, P.C.

(57) ABSTRACT

Methods and devices are described for determining reliabilities of bit positions in a bit sequence for information bit allocation using polar codes. The reliabilities are calculated using a weighted summation over a binary expansion of each bit position, wherein the summation is weighted by an exponential factor that is selected based at least in part on the coding rate of the polar code. Information bits and frozen bits are allocated to the bit positions based on the determined reliabilities, and data is polar encoded as the information bits. The polar encoded data is then transmitted to a remote device.

20 Claims, 19 Drawing Sheets

Related U.S. Application Data continuation of application No. 15/972,752, filed on May 7, 2018, now Pat. No. 10,594,438.

(60) Provisional application No. 62/503,172, filed on May 8, 2017.

(52) U.S. Cl.
CPC ............. *H04L 1/00* (2013.01); *H04L 1/007* (2013.01); *H04L 1/0041* (2013.01); *H04L 1/0057* (2013.01)

(58) Field of Classification Search
USPC .................................................. 714/776, 752
See application file for complete search history.

(56) References Cited

U.S. PATENT DOCUMENTS

| | | | | |
|---|---|---|---|---|
| 10,383,106 | B2* | 8/2019 | Shelby | ............... H03M 13/13 |
| 2016/0079999 | A1 | 3/2016 | Shen et al. | |
| 2017/0047947 | A1 | 2/2017 | Hong et al. | |
| 2017/0331590 | A1* | 11/2017 | Wu | ............... H04L 1/1819 |
| 2018/0026663 | A1* | 1/2018 | Wu | ............... H04B 1/04 |
| | | | | 714/776 |
| 2018/0076922 | A1* | 3/2018 | Zhang | ............... H04L 1/0009 |
| 2018/0076929 | A1* | 3/2018 | Zhang | ............... H03M 13/13 |
| 2019/0068316 | A1* | 2/2019 | Zhang | ............... H03M 13/13 |
| 2019/0089481 | A1* | 3/2019 | Zhang | ............... H04L 1/0061 |
| 2019/0165813 | A1* | 5/2019 | Liu | ............... H04L 1/0057 |
| 2019/0190544 | A1* | 6/2019 | Li | ............... H04L 1/0057 |

OTHER PUBLICATIONS

Qualcomm Incorporated; "FRANK polar construction: nested extension design of polar codes based on mutual Information"; R1-1706130; 3GPP TSG-RAN WG1 #88b; Spokane, WA, USA; Apr. 3-7, 2017; 25 pages.

He et al.; "β-expansion: A Theoretical Framework for Fast and Recursive Construction of Polar Codes"; ArXiv e-prints; Apr. 19, 2017; seven pages.

International Search Report and Written Opinion, Application No. PCT/US2018/031389, dated Sep. 6, 2018, 2018, 12 pages.

Office Action Search Report in Taiwanese Application No. 107115632, dated Apr. 6, 2021, 3 pgs.

* cited by examiner

ENHANCED POLARIZATION WEIGHTING TO ENABLE SCALABILITY IN POLAR CODE BIT DISTRIBUTION

PRIORITY CLAIM

This application is a continuation of U.S. application Ser. No. 16/737,021 titled "Enhanced Polarization Weighting to Enable Scalability in Polar Code Bit Distribution" and filed on Jan. 8, 2020, which is a continuation of U.S. application Ser. No. 15/972,752, titled "Enhanced Polarization Weighting to Enable Scalability in Polar Code Bit Distribution" and filed on May 7, 2018, now U.S. Pat. No. 10,594,438 issued on Mar. 17, 2020, which claims benefit of priority to U.S. Provisional Application No. 62/503,172 titled "Implementation Considerations for Polar Code Construction" and filed on May 8, 2017, which is hereby incorporated by reference in its entirety as if fully and completely set forth herein.

The claims in the instant application are different than those of the parent application and/or other related applications. The Applicant therefore rescinds any disclaimer of claim scope made in the parent application and/or any predecessor application in relation to the instant application. Any such previous disclaimer and the cited references that it was made to avoid, may need to be revisited. Further, any disclaimer made in the instant application should not be read into or against the parent application and/or other related applications.

FIELD OF THE INVENTION

The field of the invention generally relates to polar code construction.

DESCRIPTION OF THE RELATED ART

Polar codes are used in a wide variety of technological applications. When constructing a polar code, frozen bits and information bits are allocated to specific bit locations within the polar code. Existing algorithms for polar code construction may be inefficient computationally, or may otherwise introduce undesirable features into the polar code. Accordingly, improvements in the field are desired.

SUMMARY OF THE EMBODIMENTS

Various embodiments are described of systems and methods for determining reliabilities of bit positions in construction of a polar code. For example, some embodiments may relate to a user equipment (UE) or a base station (BS) that comprises at least one radio, a memory, and one or more processing elements, and which is configured to perform a subset or all of the operations described herein.

In some embodiments, a UE constructs and transmits polar encoded data. The data to be polar encoded may be stored, and a coding rate for polar encoding the data may be determined. A reliability associated with each bit position in a bit sequence may be determined by calculating a sequence of weighted summations corresponding to each of the bit positions. The reliability of each bit position may be determined from its respective weighted summation, wherein the weighted summation corresponding to each respective bit position is a weighted summation over a binary expansion of the respective bit position. The weighted summation may be weighted by a first multiplicative factor, and the first multiplicative factor may be selected based at least in part on the coding rate.

The bit positions may be rank ordered based on their respective reliabilities, and the data may be allocated as information bits in the most reliable bit positions of a polar code based on the rank ordering. The remaining portion of bit positions may be allocated as frozen bits of the polar code. The information bits and the frozen bits may be polar encoded, and the UE may then transmit the polar encoded information bits and frozen bits.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

A better understanding of the present invention can be obtained when the following detailed description of the preferred embodiment is considered in conjunction with the following drawings, in which.

Figure 1:
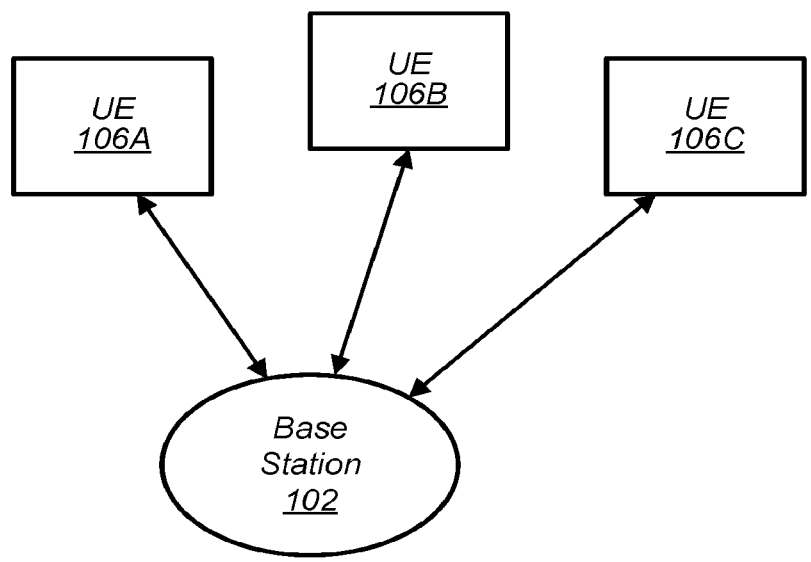
FIG. 1 is a diagram illustrating a wireless communication environment, according to some embodiments.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS OF THE INVENTION

Incorporation by Reference

The following references are hereby incorporated by reference in their entirety as though fully and completely set forth herein:

Reference 1. R1-1701702, "Construction schemes for polar codes", Huawei, HiSilicon, TSG RAN WG1 #88, February 2017.

Reference 2. R1-1706130, "FRANK polar construction: nested extension design of polar codes based on mutual information", Qualcomm Inc., TSG RAN WG1 #88bis, April 2017.

Reference 3. R1-1613006, "A Dynamically Configurable Multi-mode NR Decoder Implementation", Coherent Logix Inc., 3GPP TSG RAN WG1 Meeting #87, November 2016.

Reference 4. "β-expansion: A Theoretical Framework for Fast and Recursive Construction of Polar Codes", Cornell University Library, Apr. 19, 2017.

Terms

The following is a glossary of terms used in the present application:

Memory Medium—Any of various types of memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; or a non-volatile memory such as a magnetic media, e.g., a hard drive, optical storage, or ROM, EPROM, FLASH, etc. The memory medium may comprise other types of memory as well, or combinations thereof. In addition, the memory medium may be located in a first computer in which the programs are executed, and/or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical or optical signals.

Programmable Hardware Element—includes various hardware devices comprising multiple programmable function blocks connected via a programmable or hardwired interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Application Specific Integrated Circuit (ASIC)—this term is intended to have the full breadth of its ordinary meaning. The term ASIC is intended to include an integrated circuit customized for a particular application, rather than a general purpose programmable device, although an ASIC may contain programmable processor cores as building blocks. Cell phone chips, MP3 player chips, and many other single-function ICs are examples of ASICs. An ASIC is usually described in a hardware description language such as Verilog or VHDL.

Program—the term "program" is intended to have the full breadth of its ordinary meaning. The term "program" includes 1) a software program which may be stored in a memory and is executable by a processor or 2) a hardware configuration program useable for configuring a programmable hardware element or ASIC.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, e.g., imperative or procedural languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element or ASIC.

Computer System—any of various types of computing or processing systems, including a personal computer system (PC), mainframe computer system, workstation, network appliance, Internet appliance, personal digital assistant (PDA), grid computing system, or other device or combinations of devices. In general, the term "computer system" can be broadly defined to encompass any device (or combination of devices) having at least one processor that executes instructions from a memory medium.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Definitions of Acronyms

3GPP—Third Generation Partnership Program
5G—Fifth Generation (3GPP) cellular standard
BMS—Binary Memoryless Symmetric
FEC—Forward Error Correction
FRANK—FRActally eNhanced Kernel
PW—Polarization Weighting
RAN—Radio Access Network
TSG—Technical Standards Group
UPO—Universal Partial Order
WG—Working Group

DETAILED DESCRIPTION

FIG. 1—Wireless Communication Environment

FIG. 1 illustrates an exemplary (and simplified) wireless environment that includes multiple communication systems. FIG. 1 shows an example communication system involving a base station (BS) 102 communicating with a plurality of user equipment devices (UEs) 106A-C. The base station 102 may be a cellular base station which performs cellular communications with a plurality of wireless communication devices. Alternatively, the base station 102 may be a wireless access point for performing Wi-Fi communications, such as according to the 802.11 standard or related standards. The UEs 106 may be any of various devices such as a smart phone, tablet device, computer system, etc. One or both of the base station 102 and the wireless communication device 106 may include polar encoding logic as described herein.

In the illustrated embodiment, different UEs and the base station are configured to communicate via a broadcast network and/or a packet-switched cellular network. It is noted that the system of FIG. 1 is merely one example of possible systems, and embodiments may be implemented in any of various systems, as desired.

Cellular base station 102 may be a base transceiver station (BTS) or cell site, and may include hardware that enables wireless communication with the UEs 106A-C. The base station 102 may also be configured to communicate with a core network. The core network may be coupled to one or more external networks, which may include the Internet, a Public Switched Telephone Network (PSTN), and/or any other network. Thus, the base station 102 may facilitate communication between the UE devices 106A-C and a network.

Base station 102 and other base stations operating according to the same or different radio access technologies (RATs) or cellular communication standards may be provided as a network of cells, which may provide continuous or nearly continuous overlapping service to UEs 106A-C and similar devices over a wide geographic area via one or more RATs.

The base station 102 may be configured to broadcast communications to the UEs 106A-C. The term "broadcast" herein may refer to one-to-many transmissions that are transmitted for receiving devices in a broadcast area rather than being addressed to a particular device. Further, broadcast transmissions are typically unidirectional (from transmitter to receiver). In some situations, control signaling (e.g., ratings information) may be passed back to a broadcast transmitter from the receivers, but the content data is transmitted in only one direction. In contrast, cellular communication is typically bi-directional. "Cellular" communications also may involve handoff between cells. For example, when UE 106A (and/or UEs 106B-C) moves out of the cell served by cellular base station 102, it may be handed over to another cellular base station (and the handover may be handled by the network, including operations performed by base station 102 and the other cellular base station). In contrast, when a user moves from the range covered by a first broadcast base station to the range covered by a second broadcast base station, it may switch to receiving content from the second broadcast base station, but the base stations do not need to facilitate handover (e.g., they simply continue broadcasting and do not care which base station a particular UE is using).

Traditionally, broadcast transmissions are performed using different frequency resources than cellular transmissions. In some embodiments, however, frequency resources are shared between these different types of transmissions. For example, in some embodiments, a broadcast base station is configured to relinquish one or more frequency bands during scheduled time intervals for use by a cellular base station for packet-switched communications.

In some embodiments, control signaling transmitted by a broadcast or cellular base station may allow end user devices to maintain full signaling connectivity (which may eliminate network churn), extend battery life (e.g., by determining when to remain in a low power mode when a base station is not transmitting), and/or actively manage coverage detection (e.g., rather than perceiving spectrum sharing periods as spotty coverage or a temporary network outage).

The base station 102 and the UEs 106A, 106B, and 106C may be configured to communicate over the transmission medium using any of various RATs (also referred to as wireless communication technologies or telecommunication standards), such as LTE, 5G New Radio (NR), Next Generation Broadcast Platform (NGBP), W-CDMA, TD-SCDMA, and GSM, among possible others such as UMTS, LTE-A, CDMA2000 (e.g., 1xRTT, 1xEV-DO, HRPD, eHRPD), Advanced Television Systems Committee (ATSC) standards, Digital Video Broadcasting (DVB), etc. In general, any of the transmissions between the base station 102 and the UEs 106A, 106B, and 106C may utilize the methods of enhanced PW for polar code construction to polar encode the transmitted data, according to embodiments described herein.

Broadcast and cellular networks are discussed herein to facilitate illustration, but these technologies are not intended to limit the scope of the present disclosure and the disclosed spectrum sharing techniques may be used between any of various types of wireless networks, in other embodiments.

Figure 2:
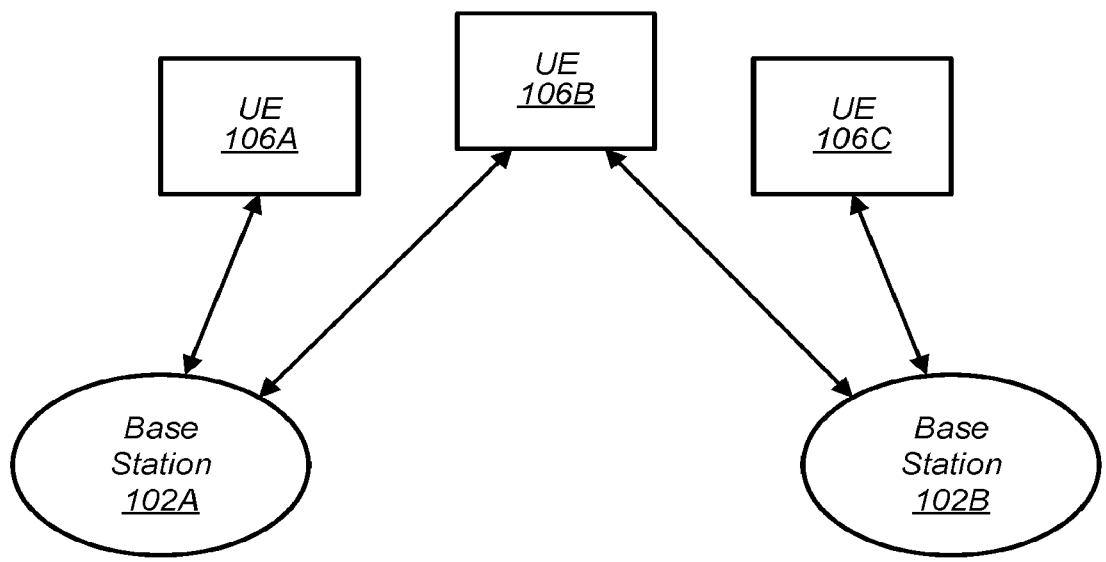
FIG. 2 is a diagram illustrating a wireless communication environment with base station coverage overlap, according to some embodiments.

FIG. 2—Wireless Communication Environment with Multiple Base Stations

FIG. 2 illustrates an exemplary wireless communication system that includes base stations 102A and 102B which communicate over a transmission medium with one or more user equipment (UE) devices, represented as UEs 106A-106C. The communication environment in FIG. 2 may function similarly to that described in FIG. 1, above. However, FIG. 2 illustrates that the center UE 106B may operate within range of both of the base stations 102A and 102B. In these embodiments, UE 106B may mistakenly receive a communication from base station 102B when it was intending to receive communications from base station 102A.

Figure 3:
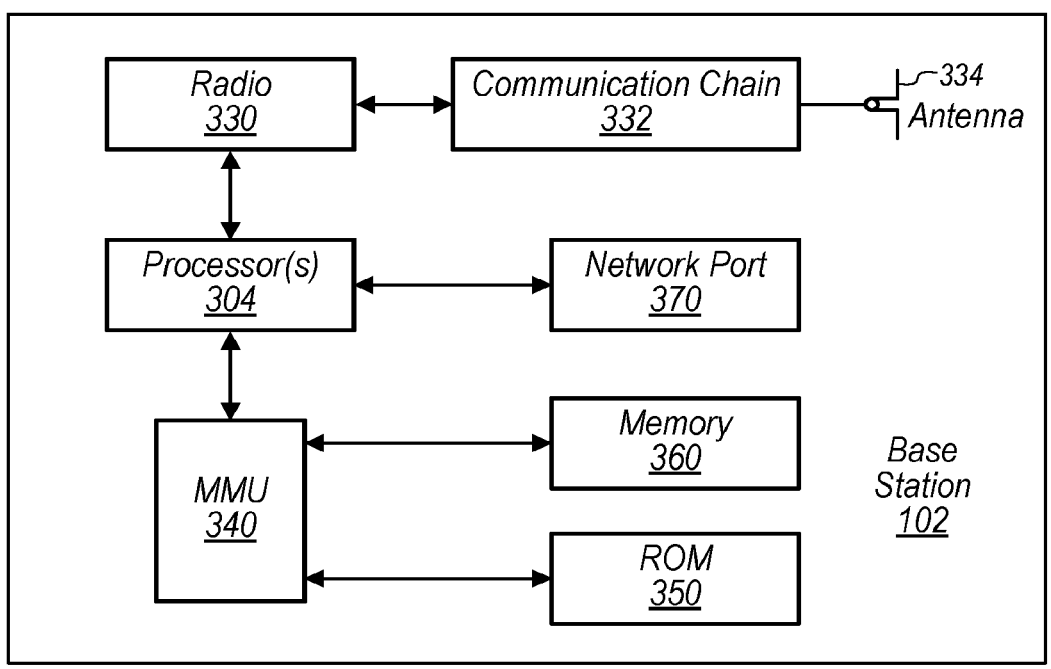
FIG. 3 is a block diagram illustrating an exemplary base station, according to some embodiments.

FIG. 3—Base Station

FIG. 3 illustrates an exemplary block diagram of a base station 102. In some embodiments, base station 102 may be a broadcast base station such as base station 102A of FIG. 2 and/or a cellular base station such as base station 102B of FIG. 2. It is noted that the base station of FIG. 3 is merely one example of a possible base station. As shown, the base station 102 may include processor(s) 304 which may execute program instructions for the base station 102. The processor(s) 304 may also be coupled to memory management unit (MMU) 340, which may be configured to receive addresses from the processor(s) 304 and translate those addresses to locations in memory (e.g., memory 360 and read-only memory (ROM) 350) or to other circuits or devices.

The base station 102 may include at least one network port 370. The network port 370 may be configured to couple to a telephone network and provide a plurality of devices, such as UE devices 106, access to the telephone network as described above. In some embodiments, the network port 370 (or an additional network port) may be coupled to a television network and configured to receive content for broadcasting. The network port 370 (or an additional network port) may also or alternatively be configured to couple to a cellular network, e.g., a core network of a cellular service provider. The core network may provide mobility related services and/or other services to a plurality of devices, such as UE devices 106. In some cases, the network port 370 may couple to a telephone network via the core network, and/or the core network may provide a telephone network (e.g., among other UE devices 106 serviced by the cellular service provider).

The base station 102 may include at least one antenna 334. The at least one antenna 334 may be configured to operate as a wireless transceiver and may be further configured to communicate with UE devices 106 via radio 330. The antenna 334 communicates with the radio 330 via communication chain 332 in the illustrated embodiment. Communication chain 332 may be a receive chain, a transmit chain or both. The radio 330 may be configured to communicate via various RATs.

The processor(s) 304 of the base station 102 may be configured to implement part or all of the methods described herein, e.g., by executing program instructions stored on a memory medium (e.g., a non-transitory computer-readable memory medium). Alternatively, the processor 304 may be configured as a programmable hardware element, such as an FPGA (Field Programmable Gate Array), or as an ASIC (Application Specific Integrated Circuit), or a combination thereof. In some embodiments, the processor, MMU, and memory may be a distributed multiprocessor system. For example, the processor system may comprise a plurality of interspersed processors and memories, where processing elements (also called functional units) are each connected to a plurality of memories, also referred to as data memory routers. The processor system may be programmed to implement the methods described herein.

In some embodiments, base station 102 is configured to perform both broadcast and bi-directional packet-switched communications. In these embodiments, base station 102 may include multiple radios 330, communication chains 332, and/or antennas 334, for example. In other embodiments, the disclosed spectrum sharing techniques may be performed by different base stations configured to perform only broadcast transmissions or only packet-switched communications.

Figure 4:
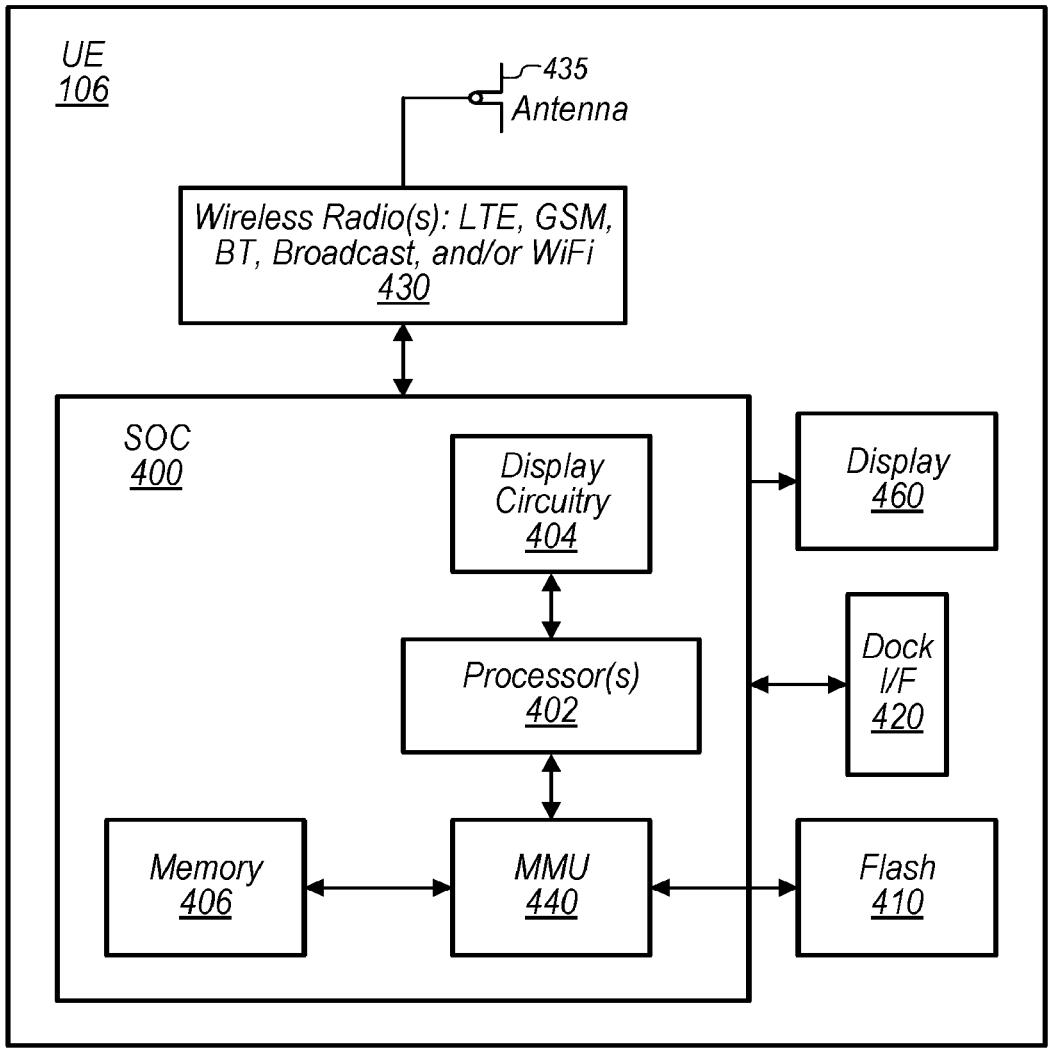
FIG. 4 is a block diagram illustrating an exemplary UE, according to some embodiments.

FIG. 4—User Equipment (UE)

FIG. 4 illustrates an example simplified block diagram of a UE 106. The UE 106 may be any of various devices as defined above. UE device 106 may include a housing which may be constructed from any of various materials.

As shown, the UE 106 may include a system on chip (SOC) 400, which may include portions for various purposes. The SOC 400 may be coupled to various other circuits of the UE 106. For example, the UE 106 may include various types of memory (e.g., including NAND flash 410), a connector interface 420 (e.g., for coupling to a computer system, dock, charging station, etc.), the display 460, wireless communication circuitry 430 such as for LTE, 5G New Radio (NR), GSM, Bluetooth (BT), WLAN, and/or broadcast, etc. The UE 106 may further comprise one or more smart cards that implement SIM (Subscriber Identity Module) functionality. The wireless communication circuitry 430 may couple to one or more antennas, such as antenna 435.

As shown, the SOC 400 may include processor(s) 402 which may execute program instructions for the UE 106 and display circuitry 404 which may perform graphics processing and provide display signals to the display 460. The processor(s) 402 may also be coupled to memory management unit (MMU) 440, which may be configured to receive addresses from the processor(s) 402 and translate those addresses to locations in memory (e.g., memory (e.g., read only memory (ROM) or another type of memory) 406, NAND flash memory 410) and/or to other circuits or devices, such as the display circuitry 404, wireless communication circuitry 430, connector I/F 420, and/or display 460. The MMU 440 may be configured to perform memory protection and page table translation or set up. In some embodiments, the MMU 440 may be included as a portion of the processor(s) 402. In some embodiments, the processor, MMU, and memory may be a distributed multiprocessor system. For example, the processor system may comprise a plurality of interspersed processors and memories, where processing elements (also called functional units) are each connected to a plurality of memories, also referred to as data memory routers. The processor system may be programmed to implement the methods described herein.

In some embodiments (not shown), UE 106 is configured to receive wireless broadcasts, e.g., from broadcast base station 102A of FIG. 2. In these embodiments, UE 106 may include a broadcast radio receiver. In some embodiments, UE 106 is configured to receive broadcast data and perform packet-switched cellular communications (e.g., LTE) at the same time using different frequency bands and/or the same frequency resources during different time slices. This may allow users to view TV broadcasts while performing other tasks such as browsing the internet (e.g., in a split-screen mode), using web applications, or listening to streaming audio. In other embodiments, the disclosed techniques may be used in systems with devices that are configured as broadcast receivers or for cellular communications, but not both.

The processor(s) 402 of the UE device 106 may be configured to implement part or all of the features described herein, e.g., by executing program instructions stored on a memory medium (e.g., a non-transitory computer-readable memory medium). In some embodiments, the processor(s) 402 may comprise a multiprocessor array of a plurality of parallelized processing elements. For example, the processor(s) 402 may be designed in accordance with the HyperX architecture described in detail in Reference 6, or another parallel processor architecture. In these embodiments, separate ones of the parallelized processing elements may be configured to perform decoding procedures on separate respective bit paths of a successive cancellation list (SCL) decoding procedure, or they may be configured to perform decoding procedures on separate encoded messages in parallel, for example. Alternatively (or in addition), processor(s) 402 may be configured as a programmable hardware element, such as an FPGA (Field Programmable Gate Array), or as an ASIC (Application Specific Integrated Circuit). Alternatively (or in addition) the processor(s) 402 of the UE device 106, in conjunction with one or more of the other components 400, 404, 406, 410, 420, 430, 435, 440, 460 may be configured to implement part or all of the features described herein.

UE 106 may have a display 460, which may be a touch screen that incorporates capacitive touch electrodes. Display 460 may be based on any of various display technologies. The housing of the UE 106 may contain or comprise openings for any of various elements, such as buttons, speaker ports, and other elements (not shown), such as microphone, data port, and possibly various types of buttons, e.g., volume buttons, ringer button, etc.

The UE 106 may support multiple radio access technologies (RATs). For example, UE 106 may be configured to communicate using any of various RATs such as two or more of Global System for Mobile Communications (GSM), Universal Mobile Telecommunications System (UMTS), Code Division Multiple Access (CDMA) (e.g., CDMA2000 1×RTT or other CDMA radio access technologies), Long Term Evolution (LTE), LTE Advanced (LTE-A), 5G NR, and/or other RATs. For example, the UE 106 may support at least two radio access technologies such as LTE and GSM. Various different or other RATs may be supported as desired.

In some embodiments, UE 106 is also configured to receive broadcast radio transmissions which may convey audio and/or video content. In still other embodiments, a UE 106 may be configured to receive broadcast radio transmissions and may not be configured to perform bi-directional communications with a base station (e.g., UE 106 may be a media playback device).

Polar Codes

Polar codes are being increasingly used in a variety of technological applications. For example, it is anticipated that 5G NR communications between a UE (such as UE 106) and a base station (such as BS 102) may employ polar codes. Polar codes are a specific type of forward error correction (FEC) codes.

Figure 5:
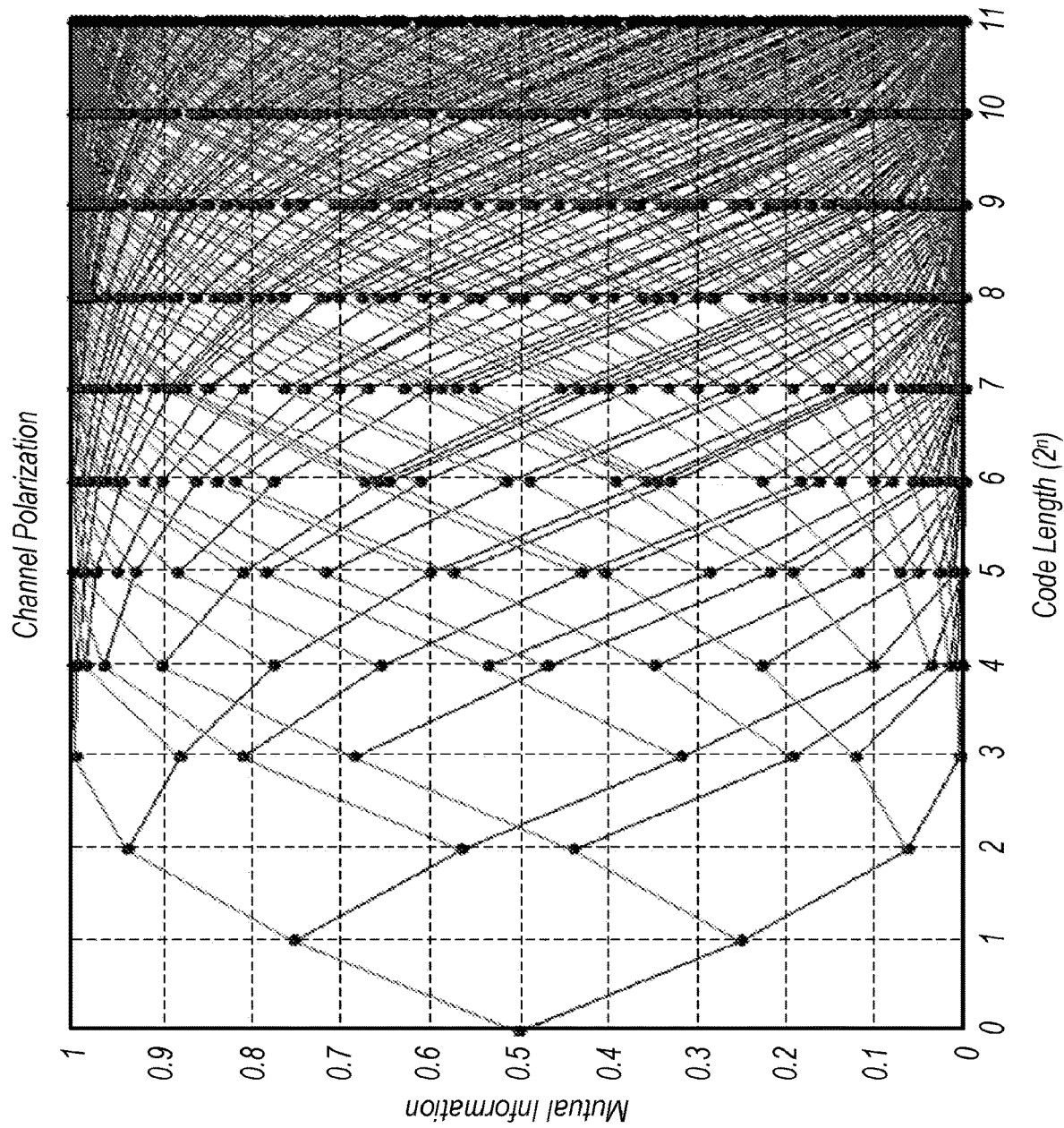
FIG. 5 illustrates an example of channel polarization, where n=11.

Methods for constructing capacity achieving codes for the memoryless binary symmetric channel are known in the art. FIG. 5 illustrates a phenomenon known as channel polarization leveraged through polar codes, wherein a polar code of length N=2048 bits is encoded through n=11 stages of polar encoding. As described in FIG. 1, the resulting polar codes leverage a phenomenon known as channel polarization which transforms a physical channel W into an arrangement of synthetic channels $W_N^i$, the respective capacities of which, i.e. maximum mutual information between channel input and output, tend toward 1 (highly reliable) or 0 (highly unreliable). The corresponding bit probabilities correspondingly approach 1 and 0.5, respectively, as the code length, N=2n, increases with positive, non-zero integer values n.

Data may be transferred by placing information on bits on the most reliable channels, and these bits may be referred to as information bits. Bits placed on the least reliable channels may be set to a fixed value, e.g. 0 or another known value or set of values that is known to both the transmitter and receiver, and these bits may be referred to as frozen bits. Frozen bits and their mapping to the code matrix may be known by both the transmitter and receiver. As a result, frozen bit positions are set to their known values by a decoding algorithm at a receiver as part of the decoding process. Constructing a polar code of block length N may entail identifying an ordered sequence that reflects the synthetic channel reliabilities, assigning user information in the most reliable channel positions, and assigning the frozen bit pattern (not precluding the all-zeros dataset) in the least reliable channel positions.

Polar codes form a class of linear block codes described by a generator matrix, G. Polar codes of block lengths N may be generated according to:

$$G = F_N \triangleq (F_2)^{\otimes n}$$

Where $F_N$ denotes the Kronecker product of $$F_2 = \begin{pmatrix} 1 & 0 \\ 1 & 1 \end{pmatrix},$$

among other possibilities.

A polar code is defined by the location of k information bits and (N-k) frozen bits in a block of length, N. The code rate, $$R = \frac{k}{N}$$

is expressed as the ratio of non-frozen bits to the block length. The code rate can be adjusted linearly by varying the number of non-frozen bits per block. Typically, the block length, N, is chosen to be a power of two, such that $N=2^n$, where n is a natural number.

In some embodiments, channel polarization splits a binary memoryless symmetric (BMS) channel $W:X \rightarrow Y$ into a pair of synthetic channels $W^0:X \rightarrow Y^2$ and $W^1:X \times Y^2$ where:

$$W^0(y_1,y_2|x_1) = \frac{1}{2} \sum_{x_2 \in X} W(y_1|x_1 \oplus x_2) W(y_2|x_2)$$

$$W^1(y_1,y_2,x_1|x_2) = \frac{1}{2} W(y_1|x_1 \oplus x_2) W(y_2|x_2)$$

Here $\oplus$ indicates an exclusive-OR (XOR) operation. This splitting may be applied n times to obtain the N=2n synthetic channels (e.g., see Reference 1 above).

The corresponding mutual information (MI) may be computed as follows:

$$I(W^1) = 2I(W) - I(W)^2$$

$$I(W^0) = I(W)^2$$

The set of synthetic channels, each with binary expansion $(b_0, b_1, \ldots, b_{n-1})$, $b_i \in \{0, 1\}$, may be defined as:

$$W_N^i = ((W^{b_0})^{b_1 \cdots})^{n_{n-1}}, i=0, \ldots, N-1$$

If the mutual information $I(W_N^i) > I(W_N^j)$, then it may be determined that the synthetic channel $W_N^i$ is more reliable than $W_N^j$, denoted as $W_N^i \succ W_N^j$, where $I(W) \triangleq I(X;Y)$.

Mutual information, which may be defined as $$I(X; Y) = \sum_{y \in Y} \sum_{x \in X} p(x, y) \log\left(\frac{p(x, y)}{p(x)p(y)}\right),$$

provides a measure of the information a pair of random variables share, i.e. how much knowing one variable reduces the uncertainty of knowing the other, where p(x,y) is the joint probability function of X and Y, and p(x) and p(y) are the marginal probability distribution functions of X and Y, respectively. If X and Y are independent, $p(x,y)=p(x)p(y)$ yielding $$\log\left(\frac{p(x, y)}{p(x)p(y)}\right) = \log(1) = 0,$$

i.e. the mutual information between random variables X and Y is zero.

Figure 6:
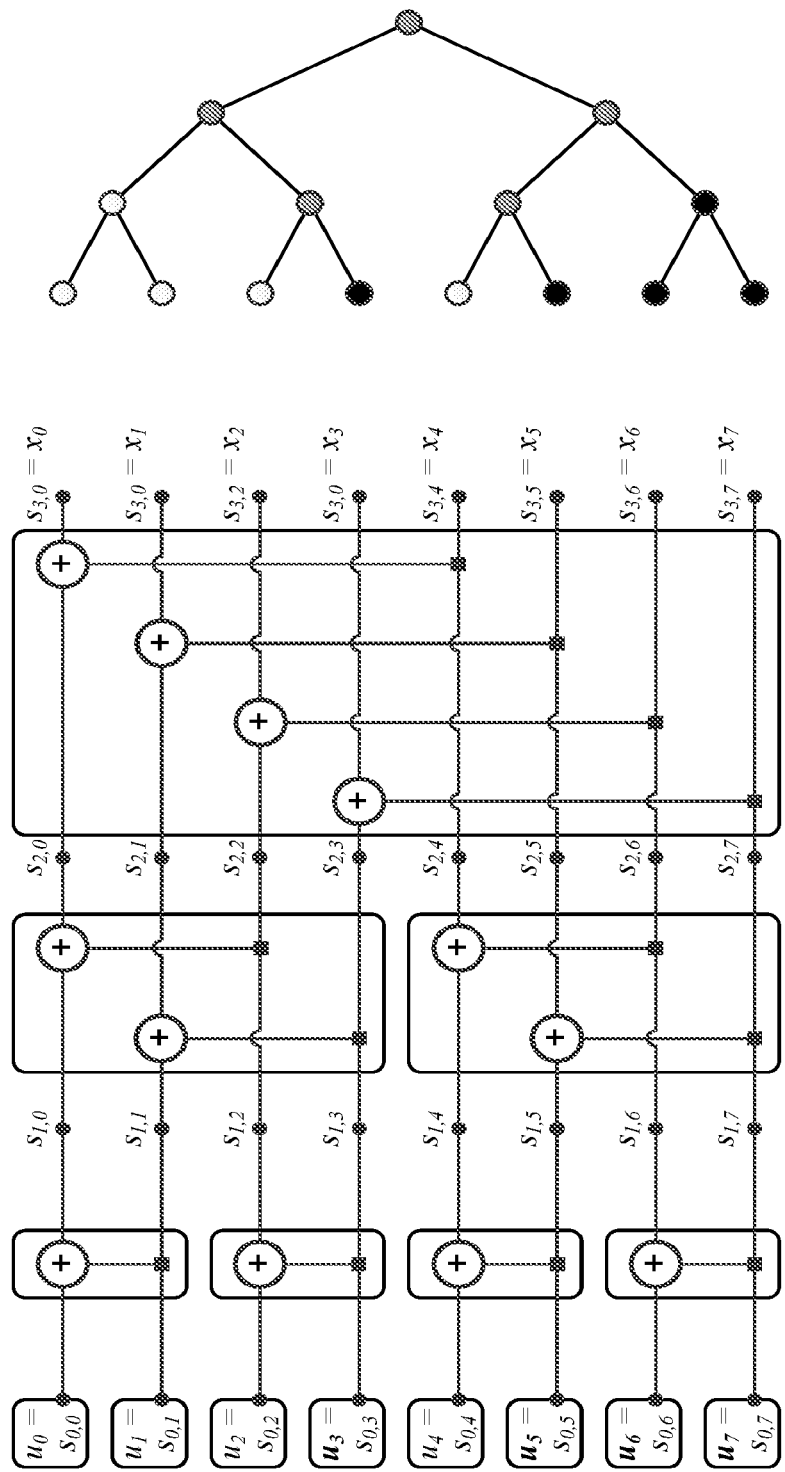
FIG. 6 illustrates an example polar encoder, where n=3.

FIG. 6—Exemplary Polar Encoder

FIG. 6 shows a sample polar code construction for block length $N=2^3$. The encoder begins with inputs, which are encoded into outputs, $x_i$. Information bits are shown in bold. The remaining inputs may be assigned frozen bit values, 0. At each stage, s, the encoder combines pairs of bits according to the encoding tree shown to the right.

Polar Code Construction

Polar code construction involves a permutation in bit position to reflect a rank ordering of the synthetic channel reliabilities. To construct a code of length N, the information bit set is mapped to the K most reliable channel positions while the frozen bit set is placed in the remaining N-K channel positions. The code rate is computed as R=K/N, i.e. the ratio of the number of information bits to the code block length.

The recursion needed to compute the exact synthetic channel reliabilities for a given block size N represents considerable computational load. As a result, a number of computationally less expensive methods have been proposed to arrive at ordering the bit positions in a manner that approximates the exact channel reliabilities. In other words, to reduce computational load and time requirements, approximate methods of allocating information bits in a polar code have been developed.

Various methods are known in the art for polar code construction, such as Polarization Weight (PW) (see Reference 1, above) and FRActally eNhanced Kernel (FRANK) polar code construction (see Reference 2, above). While both PW and FRANK are able to allocate information bits in a polar code with reasonable accuracy, they both exhibit limitations with respect to their accuracy (e.g., their accuracy relative to the exact synthetic channel reliabilities), latency of computation, and finite precision effects.

Embodiments herein improve upon legacy PW and FRANK polar code construction by implementing an enhanced PW polar code construction, to improve computational efficiency and information bit allocation. Some embodiments herein present novel means for efficient computation of the ordered sequence and assignment of bit positions as implemented in a finite precision Memory in Network Processor (MiNP) architecture such as that described in Reference 3, above.

Enhanced Polarization Weighting (PW)

Embodiments herein describe an enhanced PW methodology for allocating information bits in a polar code. Enhanced PW utilizes a technique known as β-expansion, which provides a theoretical framework to enable fast determination of the ordered sequence used in polar code construction. Enhanced PW utilizes a generalized β-expansion, the procedure for which can be summarized as follows:

Take $B_i \triangleq b_{n-1}b_{n-2} \ldots b_0$ as the binary expansion of the synthetic channel index, $i=0, 1, \ldots, N-1$, where $b_j \in \{0,1\}$, $j=[0,1,\ldots, n-1]$, Compute the polarization weights, $$w_i = \sum_{j=0}^{n-1} b_j \cdot \beta_j,$$

where $\beta_j = 2^{j\frac{1}{m}}$ where the integer value, m>0, determines the rate of expansion, i.e. $w_i = b_{n-1} \cdot 2^{\frac{n-1}{m}} + b_{n-2} \cdot 2^{\frac{n-2}{m}} + \ldots + b_0 \cdot 2^{\frac{0}{m}}$ Sort such that $w_{Q_0} \leq w_{Q_1} \leq w_{Q_2} \leq \ldots \leq w_{Q_{N-1}}$ then save the resulting indices as the ordered sequence, $q_0^{N-1}$.

Traditional PW implementations use a fixed value of m=4 in the β-expansion. Embodiments herein improve upon legacy PW implementations by generalizing the β-expansion to other values of m. Advantageously, and as described in further detail below, strategically selecting m based on the coding rate and/or the block size of the polar code may improve the accuracy of the resulting information block allocation.

Additionally, while the PW method as proposed for 3GPP 5G polar code construction is based on β-expansion (See Reference 2), a competing framework, FRANK (FRActally eNhanced Kernel) (See Reference 3), claims scalability with code rate (i.e. the number of information bits K for a given block size N) as its principal advantage over the legacy PW method. Embodiments herein which extend the PW method to include a variable expansion factor, e.g. $\beta=2^{1/m}$, may yield bit distributions that scale with code rate in a manner comparable to that exhibited with FRANK, but without some of the computational shortcomings associated with FRANK, as described in greater detail below. For example, β may be tuned based on block size and code rate in a manner that improves the resulting match to the computed channel reliabilities.

Figure 7:
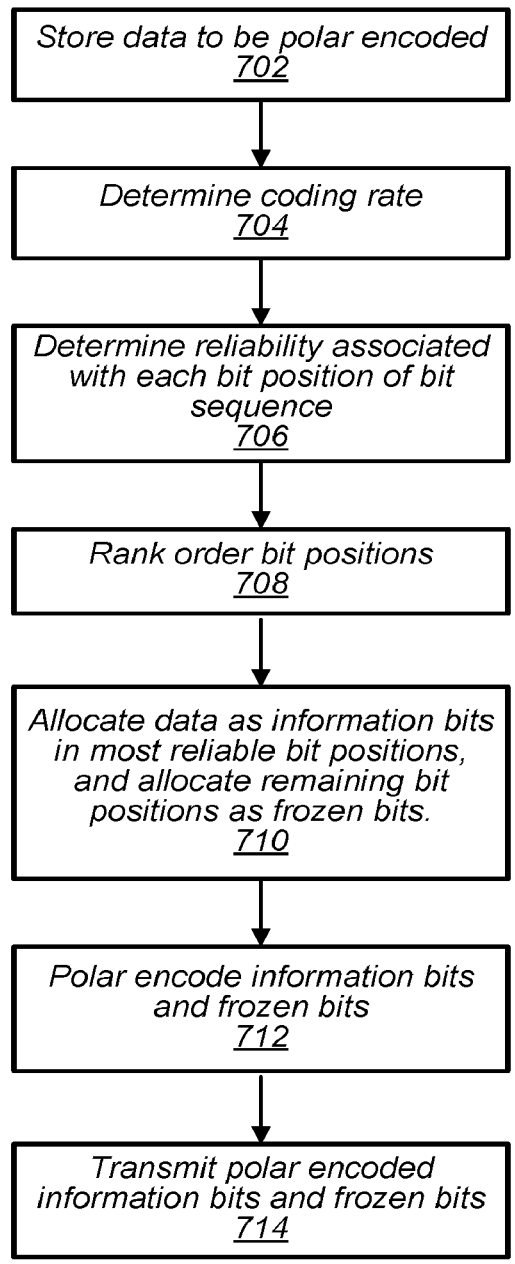
FIG. 7 is a flow diagram illustrating an exemplary method for a transmitter to encode a message with polar codes using enhanced polarization weighting (PW) code construction, according to some embodiments.

FIG. 7—Enhanced PW Polar Code Construction

FIG. 7 is a flowchart diagram illustrating a method for transmitting polar coded data, wherein the polar code has been constructed using enhanced PW, according to some embodiments. The method shown in FIG. 7 may be used in conjunction with any of the systems or devices shown in the above Figures, among other devices. For example, the method shown in FIG. 7 may be used by a UE 106 in communication with another UE or a base station 102, or by a base station in communication with a UE or another base station. More generally, the method may be employed by any wired or wireless polar encoded transmission from one device to another. In various embodiments, some of the method elements shown may be performed concurrently, in a different order than shown, or may be omitted. Additional method elements may also be performed as desired. As shown, this method may operate as follows.

At 702, data to be polar encoded may be stored. The data may be stored in a memory of a UE device, or another type of device configured to transmit polar coded data.

At 704, a coding rate for polar encoding the data may be determined. The coding rate K may be determined based on a variety of factors, including signal strength, channel conditions, transmission power, battery level of the device, etc. For example, under good channel conditions a higher coding rate may be used to transmit data with a more efficient throughput. In contrast, under poor channel conditions a lower coding rate may be used to ensure that data is only transmitted on very reliable bits, to reduce the likelihood of transmission errors.

At 706, a reliability associated with each position in a bit sequence may be determined. The reliabilities may be determined by calculating a sequence of weighted summations corresponding to each of the bit positions. The reliability of each bit position may be determined from its respective weighted summation, wherein the weighted summation corresponding to each respective bit position is a weighted summation over a binary expansion of the respective bit position. For example, the weighted summation may be performed according to enhanced PW utilizing a generalized β-expansion, as variously described above.

The summation may be weighted based on the determined coding rate for polar encoding the data. For example, the weighted summation may be weighted by a first multiplicative factor, wherein the first multiplicative factor is selected based at least in part on the coding rate. In some embodiments, the multiplicative factor may be an exponential quantity (e.g., $2^x$ for some value of x, or another exponential quantity), and the exponential quantity may comprise a first exponential factor, wherein the first exponential factor is the exponential power of each term in the binary expansion being summed over. For example, as described in greater detail above, the term in a binary expansion corresponding to $8=2^3$ may be associated with a first exponential factor of 3. In some embodiments, the exponential quantity may further comprise a second exponential factor, $1/m$, wherein the second exponential factor comprises an adjustable parameter that is tunable based at least in part on the coding rate.

Figure 16:
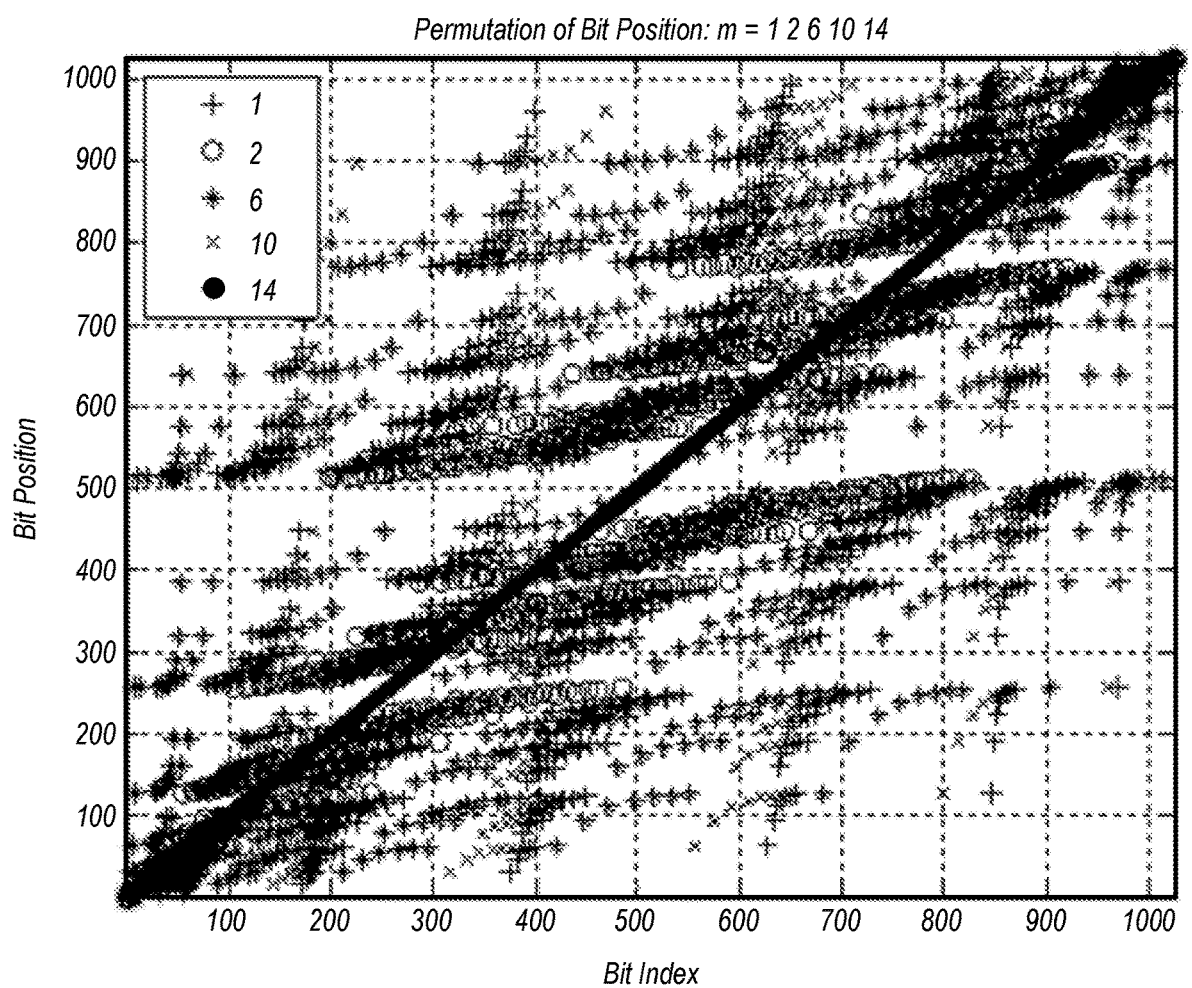
FIG. 16 is a scatter plot of bit position as a function of bit index using enhanced PW according to a variety of values of m, according to some embodiments.
Figure 18:
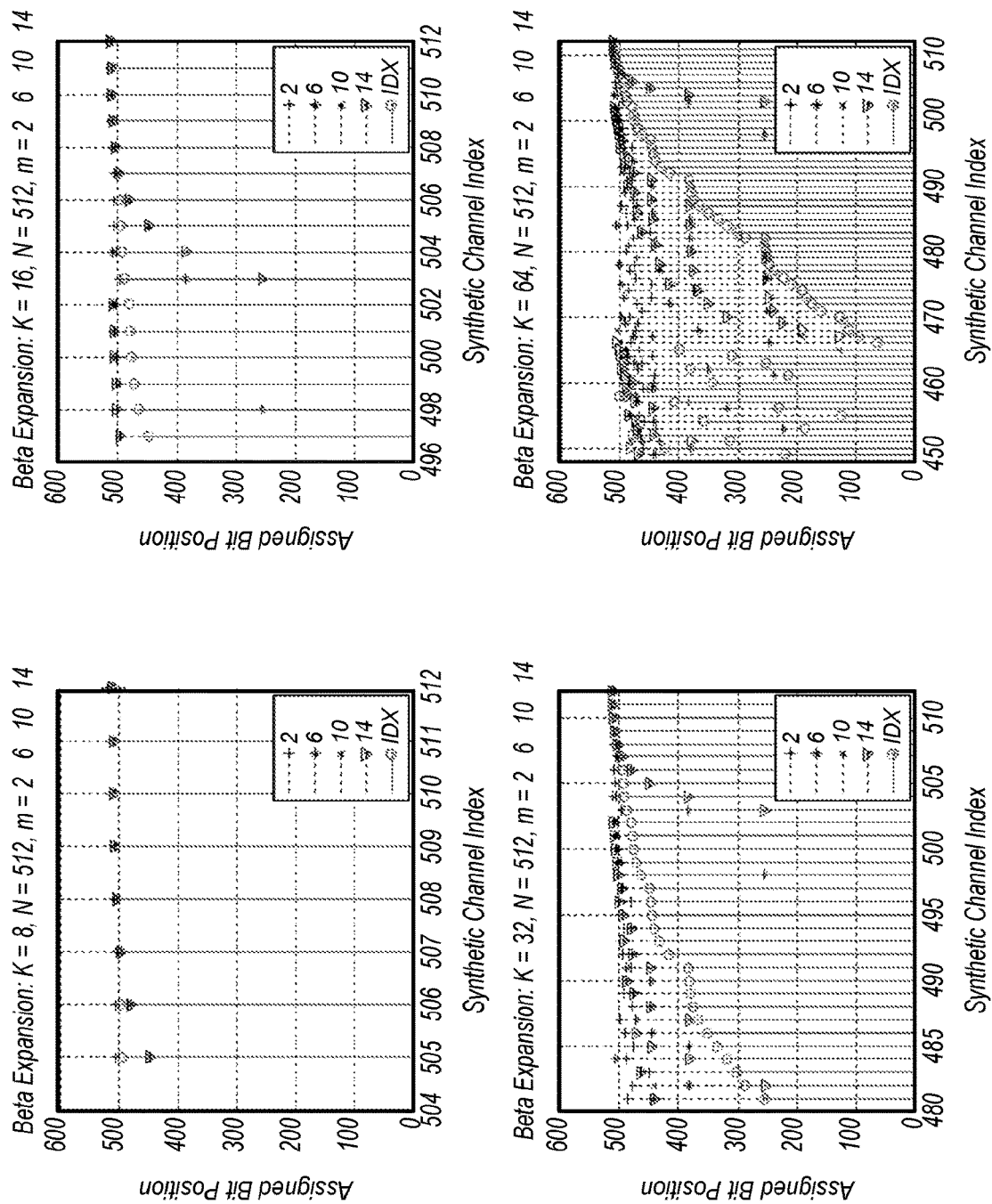
FIG. 18 illustrates four scatter plots comparing the actual assigned bit positions from the computed channel reliabilities to the results obtained using enhanced PW with various values of m, for four different code rates.
Figure 19:
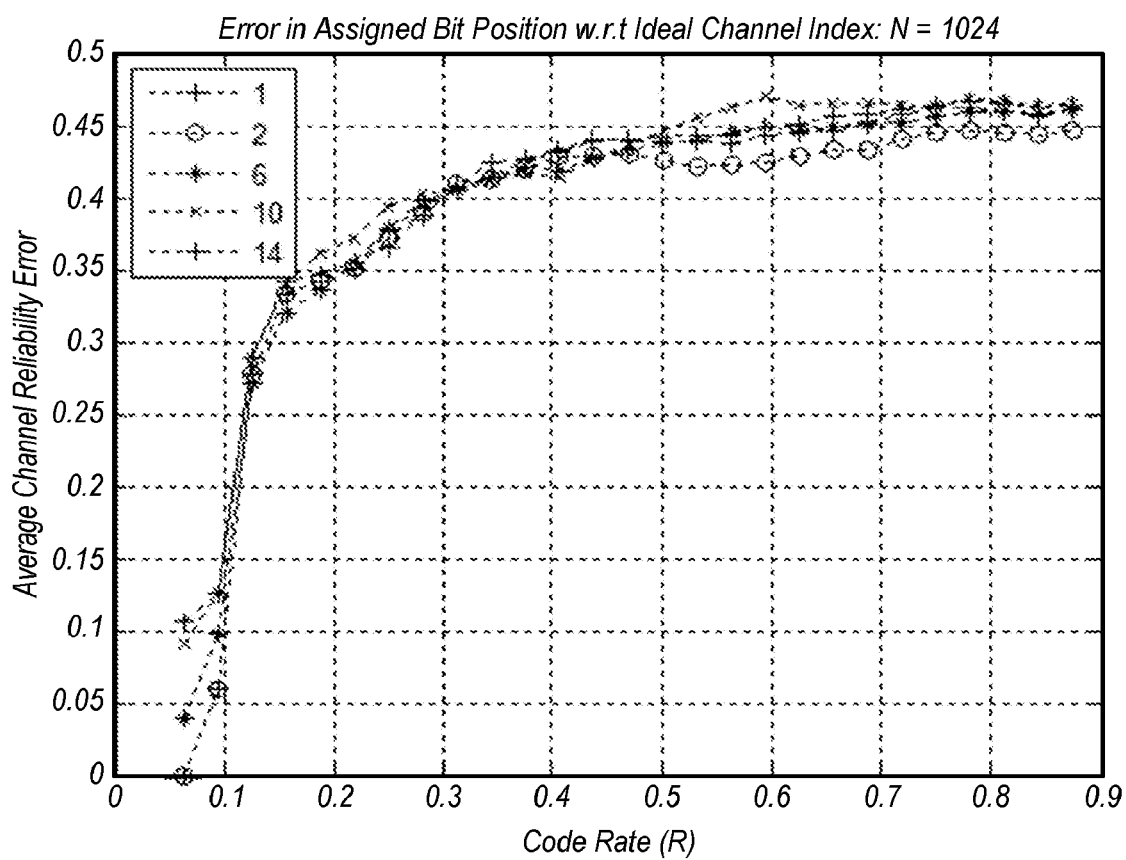
FIG. 19 is a scatterplot illustrating average error in assigned channel reliability obtained using enhanced PW relative to the computed channel reliabilities as a function of code rate; according to some embodiments.

As described in greater detail below, the exact channel reliabilities at higher code rates may be more closely approximated by enhanced PW if larger values of m are used. For example, as illustrated in FIGS. 18-19 below, for a low code rate of K=16 (top left of FIG. 18) the exact channel reliability ("IDX" in FIG. 18) is more closely approximated by m=2 than by m=14. In contrast, at the higher code rates of K=64 and K=128 (bottom left and bottom right of FIG. 18) the exact channel reliability is more closely approximated by m=14 than m=2. As illustrated in FIG. 16, larger values of m produce an information bit allocation with more information bits at earlier bit positions than smaller values of m. Similarly, larger coding rates result in exact channel reliabilities that promote information bit allocation with earlier bit positions. One limitation of traditional PW implementations is that it is ineffective at allocating information bits to earlier bit locations for higher code rates. By using a larger value of m for higher code rates, and a smaller value of m for smaller code rates, enhanced PW is able to more closely approximate the exact channel reliabilities.

In some embodiments, the second exponential factor is further selected to spread a distribution of the information bits of the polar code to earlier bit positions relative to that obtained from selecting a first exponential factor of ¼. For example, as illustrated in FIG. 16, larger values of m produce an information bit allocation that is more widely spread throughout the bit positions of the bit sequence than smaller values of m. Because the information bit allocation corresponding to the exact channel reliabilities are more widely distributed throughout the bit sequence for larger coding rates, increasing the value of m, to be larger than m=4 may more closely approximate the information bit allocation corresponding to the exact channel reliabilities for larger coding rates.

In some embodiments, the summation may be weighted further based on a block size of the polar code (e.g., the multiplicative factor may be further selected based on the block size of the polar code). For example, as described in greater detail below in reference to Table 4, an error magnitude may be determined for various values of m for each value of block size and coding rate employed by the polar code. A value of m may be selected that minimizes the discrepancy between the determined reliabilities and the exact channel reliabilities.

In some embodiments, the multiplicative factor is further selected such that the polar code approximates a corresponding polar code, wherein the corresponding polar code implements the determined coding rate and is constructed using an alternative polar code construction methodology. For example, the polar code may be constructed according to an enhanced polarization weighting methodology, and the alternative polar code construction methodology may comprise a FRANK polar code construction methodology. As explained in greater detail below in reference to Table 3, altering the value of m depending on the value of the coding rate K may result in identical information bit allocation in the K011 [192,255] block for enhanced PW and FRANK polar code construction.

In some situations, FRANK may result in a more desirable information bit allocation (e.g., FRANK tends to allocate more information bits earlier in the polar code, leading to faster reception of information bits by the receiver and resulting in a closer approximation to the exact channel reliabilities). However, as explained in further detail below, FRANK may be subject to adverse finite precision effects, whereas finite precision effects are negligible with PW. Enhanced PW, which may be used to approximate the information bit allocation of FRANK while avoiding the finite precision effects of FRANK, may therefore offer substantial improvement over existing methods for polar code construction.

Referring back to FIG. 7, at 708 the bit positions may be rank ordered based on their respective reliabilities. For example, the bit positions may be rank ordered in ascending order of their respective determined reliabilities.

At 710, the data may be allocated as information bits in the most reliable bit positions of the polar code based on the rank ordering. The remaining bit positions may be allocated as frozen bits of the polar code.

At 712, the information bits and the frozen bits may be encoded. For example, the information bits and the frozen bits may be processed through a polar encoding algorithm to obtain polar encoded information bits and frozen bits.

At 714, the polar encoded information bits and frozen bits may be transmitted. For example, a UE may wirelessly transmit the polar encoded information bits and frozen bits as a polar encoded message to another remote UE or to a base station.

In some embodiments, the method described in reference to steps 702-714 may be repeated for second data to be polar encoded according to a second coding rate. For example, second data to be polar encoded may be stored, and a second coding rate for polar encoding the second data may be determined. If the second coding rate is different from the first coding rate, second reliabilities may be determined using weighted summations, wherein the weighted summation is weighted by a second multiplicative factor that is selected based on the second coding rate. In other words, in subsequent rounds of data transmission, the UE may adapt the reliability determination based on the coding rate used for each particular data transmission. For example, the UE may correspondingly perform second rank ordering of the bit positions based on their respective second reliabilities, encode the second data in the most reliable bit positions as information bits of a second polar code based on the second rank ordering, allocate the remaining portion of bit positions as frozen bits of the second polar code, and transmit the information bits and the frozen bits of the second polar code.

Detailed Analysis of FRANK, PW, and Enhanced PW

The following sections present a more detailed analysis of information bit allocation results for each of FRANK, PW, and enhanced PW methodologies. These sections provide additional detail and support for advantages incurred by the described methods of FIG. 7.

Universal Partial Order (UPO)

A partial order of reliability measure exists for any binary symmetric channel. This reliability measure may be insufficient to form a fully ordered sequence over N bit positions, each corresponding to an index of the synthetic channel, and is therefore deemed partial.

Addition: Given a synthetic channel whose index $C_A$ has a binary representation $(b_3, b_2, 1, b_0)$, it is less reliable than the synthetic channel whose binary index $C_B$ has a binary representation $(b_3, b_2, 0, b_0)$. Considering the occurrence of "1 > 0" in one or multiple bit positions:

2(0,1,$\underline{0}$) < 3(0,1,$\underline{1}$).
9(1,$\underline{0,0}$,1) < 15(1,$\underline{1,1}$,1).

Left-Swap: Given a so-called left-swap such that "0 . . . 1 < 1 . . . 0" where the pattern can occur multiple times and the bit positions need not be adjacent:

2($\underline{0,1}$,0) < 4($\underline{1,0}$,0),
12($\underline{0,1,1}$,0,0) < 24($\underline{1,1,0}$, 0,0).

The above properties are used to assess relative reliabilities between pairs of channel indices (x, y), a subset of which cannot be determined by Addition or Left-swap or their combination. These orders are consequently unknown to UPO (hence the term partial order):

3(0,1,1) and 4(1,0,0),
7(0,1,1,1) and 12(1,1,0,0).

The UPO is referred to as "universal" because the approach holds for any binary symmetric channel.

Polarization Weighting (PW)

PW polar code construction is a method based in Binary Expansion (BE), and aimed at addressing the reliability order issue. The procedure for deriving the ordered sequence and info/frozen bit positions using PW polar code construction may be summarized as follows:

A signal-to-noise ratio (SNR)-independent reliability estimation is performed by computing the reliability of each sub-channel (offline operation), and storing the ordered index sequence, $Q_0^{N_{max}-1}$ for the polar code of maximum code length $N_{max}$. The reliability order of sub-channels is estimated through a weight sequence $W_0^{N_{max}-1}$ calculated as follows:

Assume $i \triangleq b_{n-1} b_{n-2} \ldots b_0$ with $b_j \in \{0,1\}$, j=[0,1, . . . , n−1], then, $$W_i = \sum_{j=0}^{n-1} b_j * 2^{j*\frac{1}{4}},$$

where $n = \log_2(N)$.

Design Analysis for PW—Computational Load

The PW method of code construction involves two sets of computations: (i) accumulating the weighted sum of each x-domain index; (ii) rank ordering the weighted sums to determine the u-domain mapping.

In computing the weighted sum in PW, the progression in $\beta_j$ may be computed offline using the formula:

$$\beta_j = 2^{j\frac{1}{4}}.$$

The weighted sum computation amounts to a series of summations of the form $W_i = \sum_{j=0}^{n-1} b_{i,j} \cdot \beta_j$, i=0, . . . , N−1, requiring n·N real multiply accumulate operations for the entire weighted set, $W_0^{N-1}$. This calculation may be parallelized along dimensions, i or j, as needed to reduce latency.

In performing the rank ordering, the weighted sums may be rank ordered with N·log$_2$N complexity. This complexity reduces to n·N, given that n=log$_2$N. This computation cannot be easily parallelized. However, given modest block sizes, this computation may be performed online.

Figure 8:
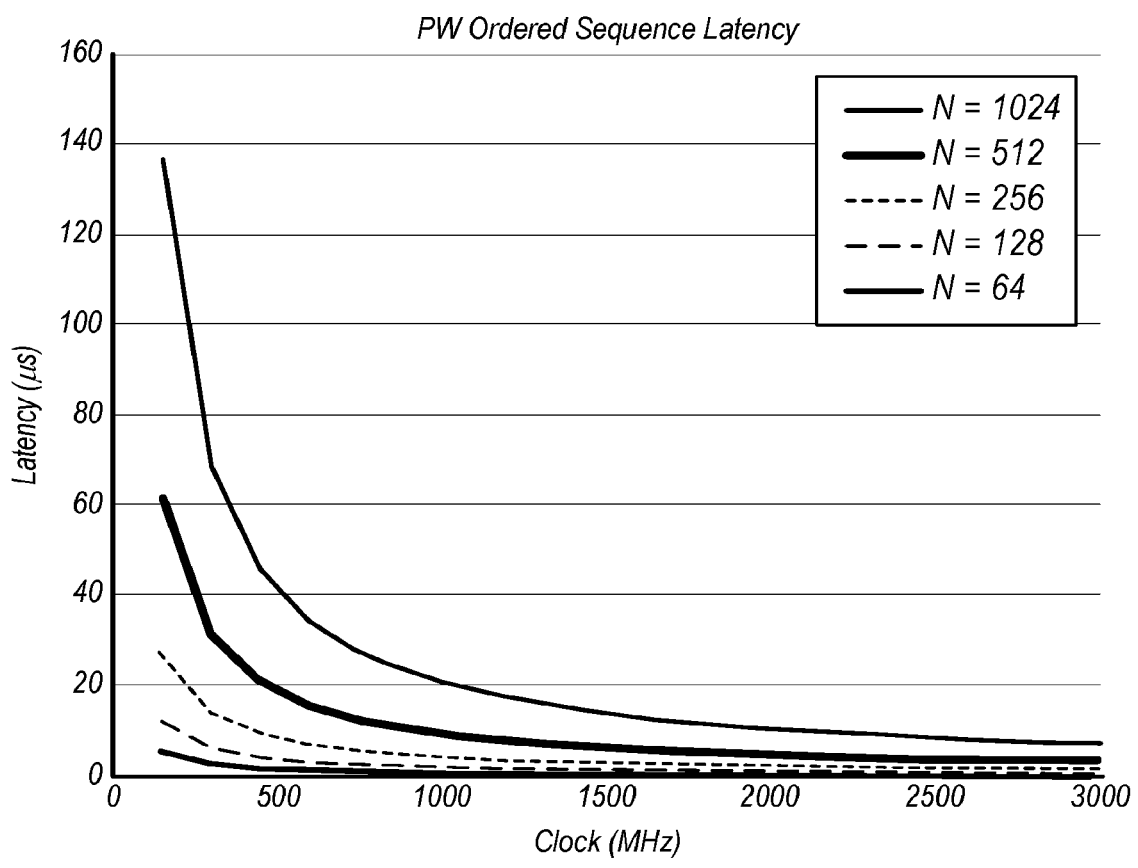
FIG. 8 is a plot of PW ordered sequence latency as a function of clock speed for a variety of values of code sizes, according to some embodiments.

FIG. 8: Latency Analysis—PW Ordered Sequence Generation

FIG. 8 is a plot of PW ordered sequence latency as a function of clock speed for a variety of values of code sizes, N. As illustrated, the latency for the ordered sequence computation is less than 20 μs given a minimum of a 1 GHz clock and assuming no parallelism. With a minimum 500 MHz clock, the latency remains below 50 μs for even the largest block size. Taking opportunities to parallelize the weighted sum calculation into account, the latency may be further reduced below that illustrated in FIG. 8.

Figure 9:
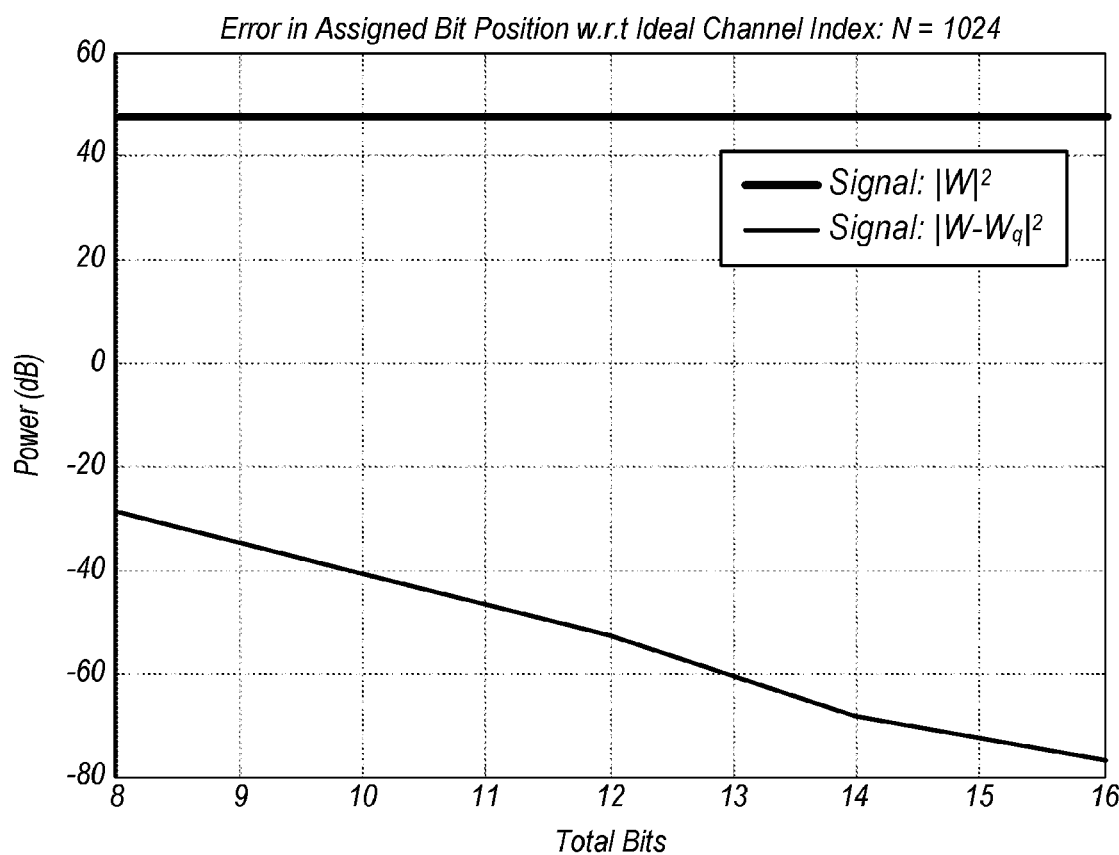
FIG. 9 is a graph of the power of the signal and error using PW as a function of total bit number, according to some embodiments.

FIG. 9: Quantization Error Analysis—PW Ordered Sequence Generation

FIG. 9 is a graph of the power of the signal ($|W|_2$) and error ($|W-W_q|^2$) using PW as a function of total bit number. The dynamic range for the weighted sum computation is bounded by zero for i=0=[000 . . . 0]$_2$ and $\Sigma \beta_j$ for i=N−1= [111 . . . 1]$_2$. Given $$\beta_j = 2^{j\frac{1}{4}},$$

the maximum value for the weighted sum can be shown to be $W_{max}$=19.8556. The relative mean-squared error is shown in FIG. 9 for a range of bit representations assuming 5 bits to the left of the decimal point with the remaining bits used to represent the fractional portion. The quantization noise power is reduced below 75 dB for modest bit widths. The MiNP architecture being used for the evaluation illustrated in FIG. 9 is based on 16-bit data. As illustrated, quantization error is negligible for the PW method.

FRActally eNhanced Kernel (FRANK)

FRANK polar code construction was introduced to provide a theoretically justifiable framework for scalable polar code sequence construction with low description complexity to enable online construction. The procedure for deriving the ordered sequence and info/frozen bit positions using FRANK may be summarized as follows:

1) Construct a short reference sequence based on Nested mutual information (MI) density evolution (DE), or other schemes.

2) For each (N, K) code, recursively partition a long codeword into groups of small length (the shortest length equals the length of the constructed short reference sequence) and allocate a number of information (info) bits Ki to each group based on the information-bit ratio according to the MI ratio formula, and taking into account punctured bits and/or shortened bits.

3) Generate information bit locations of the group of length Nref based on the short reference sequence and a number of information bits in that group when the block of length Nref or shorter is reached.

Figure 10:
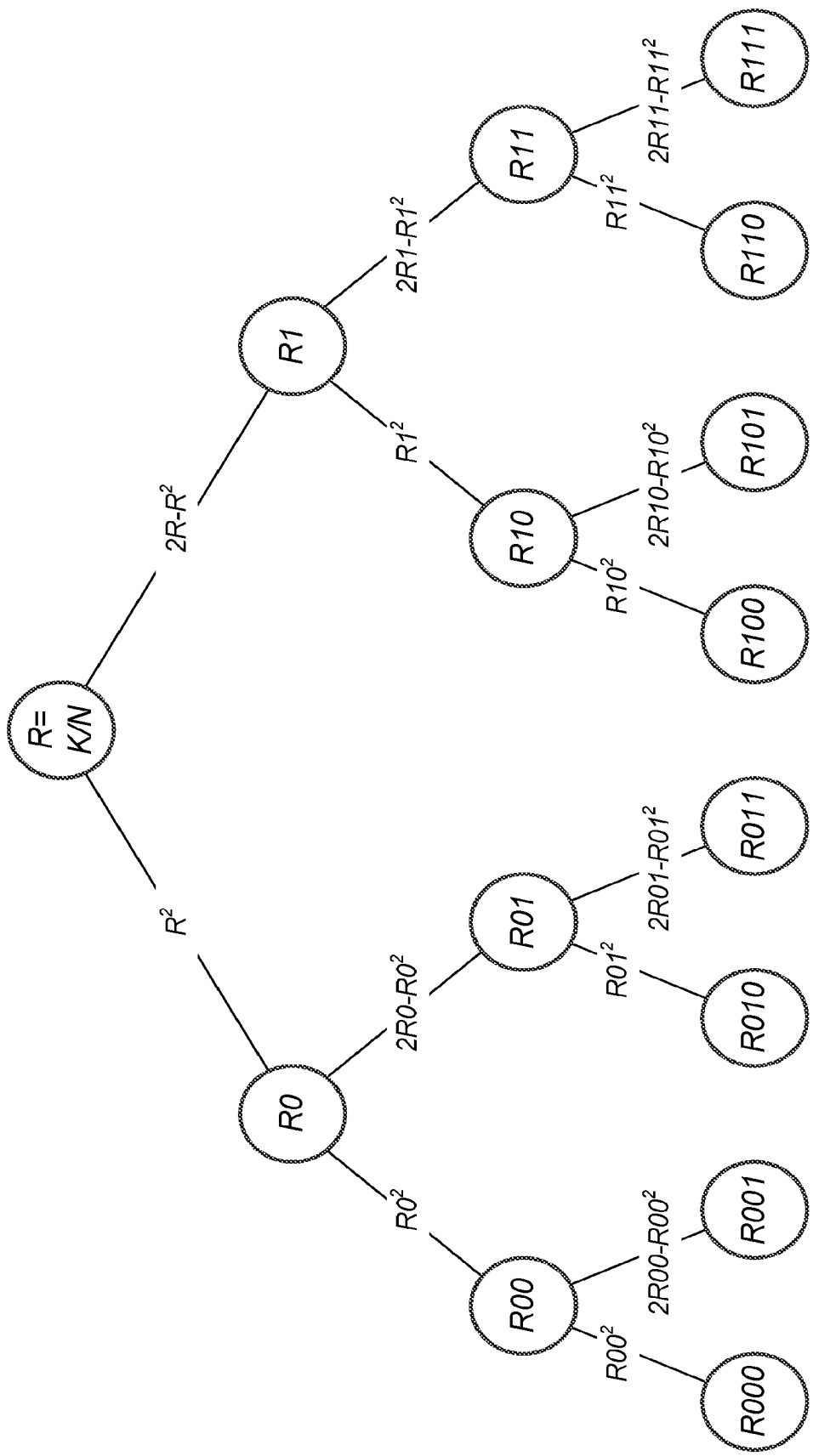
FIG. 10 illustrates a typical mutual information (MI) recursion method employed according to FRActally eNhanced Kernel (FRANK) polar code construction, according to some embodiments.

FIG. 10: FRANK MI Recursion

FIG. 10 illustrates a typical mutual information (MI) recursion method employed according to FRANK polar code construction.

In the case where the code size is a power of 2, $N=2^m$, the information bit distribution is based on a MI calculation where the input MI to the recursion is set to capacity MI=R=K/N (that is, the maximum rate a channel code can support). Recursive calculation of the rate allocation for each group, e.g. R0, R1, and subsequently, R00, R01, R10, R11, etc. is carried out as depicted in FIG. 10.

Design Analysis for FRANK—Computational Load

Figure 11:
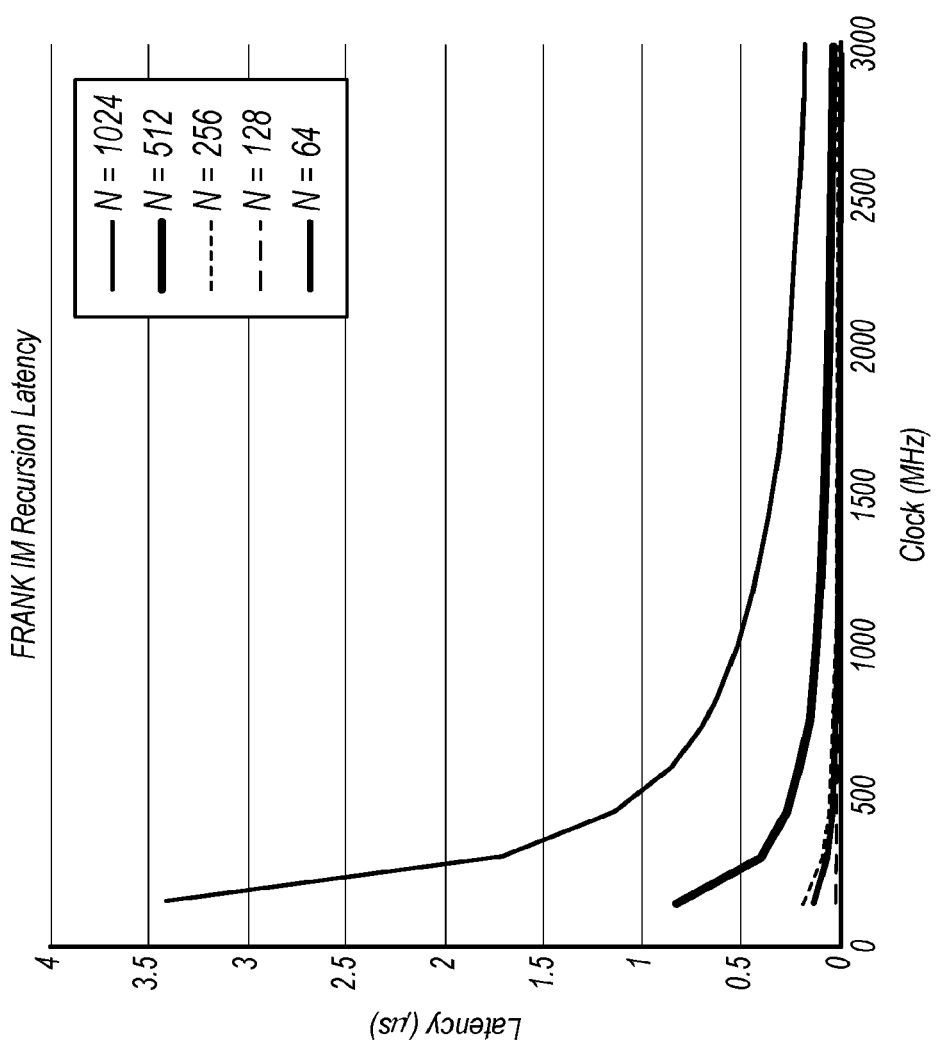
FIG. 11 is a plot of recursion latency as a function of clock speed using FRANK for different values of N, according to some embodiments.

The computational load in FRANK is usually dominated by $R^2$ and $2R-R^2$ computation pairs. M segments of Nref each require $m=\log_2 M$ stages, incurring $2^1+2^2+2^3+\ldots$ computation pairs. Each pair requires one multiply and one multiply-accumulate for a total of two operations per pair, per stage. The total number of operations is given by $2 \cdot \Sigma_{i=1}^{m} 2^m = 2^{m+2} - 4$. N=1024 and Nref=64, M=16 requires m=4 stages. The total operation count is 26200. As illustrated in FIG. 11, which is a plot of recursion latency as a function of clock speed using FRANK for different values of N, the corresponding latency is negligible for any clock speed.

FRANK—Finite Precision Effects

The precision requirements for polar codes constructed using FRANK are determined by $R-R^M$ terms which, for low code rates and long block sizes, may cause an underflow in fixed-point representation resulting in fewer assigned bit indices than required for the selected code rate. However, taking the coarse granularity associated with distributing K information bits to M sub-blocks, the precision requirements may be relaxed. A heuristic approach suggests that 13 or 14 fixed-point bits may suffice for accurate computation.

The choice of information bit distribution among respective groups of length Nref is established in Reference 2 as being instrumental in devising a code that is capacity achieving. Table 1, below, lists the K-distribution for FRANK alongside that for enhanced PW. Note that the enhanced PW K-distribution may be tuned to approximate the sparsity of information bits in the upper part of the FRANK code sequences. This consideration has been taken into account to promote an equitable side-by-side comparison. The baseline case of legacy PW, $m_4=4$, is highlighted in bold.

TABLE 1

Bit Distribution in Enhanced PW and FRANK

| | FRANK | | | | | PW: $\beta = 2^{1/m}$, K = 64 | | | | |
|---|---|---|---|---|---|---|---|---|---|---|
| | K = 32 | K = 48 | K = 64 | K = 80 | K = 96 | $m_1$ | $m_2$ | $m_3$ | $m_4$ | $m_5$ |
| K00[0, 63] | 0 | 0 | 0 | 0 | 0 | 0 | 0 | 0 | 0 | 0 |
| K01[64, 127] | 0 | 0 | 0 | 0 | 0 | 0 | 0 | 0 | 0 | 1 |
| K02[128, 191] | 0 | 0 | 0 | 0 | 0 | 0 | 0 | 0 | 0 | 1 |
| K03[192, 255] | 1 | 2 | 4 | 6 | 9 | 1 | 2 | 5 | 7 | 8 |
| K10[256, 319] | 0 | 0 | 0 | 0 | 1 | 0 | 0 | 0 | 1 | 1 |
| K11[320, 383] | 2 | 4 | 7 | 10 | 14 | 8 | 10 | 11 | 11 | 10 |
| K2[384, 447] | 3 | 7 | 11 | 16 | 20 | 19 | 17 | 16 | 15 | 14 |
| K3[448, 511] | 26 | 35 | 42 | 48 | 52 | 36 | 35 | 32 | 30 | 29 |

Embodiments herein analyze PW code construction alongside FRANK code construction to obtain a modified PW code that offers improved efficiency for polar code construction. The two methods were examined to identify any substantive differences from an implementation standpoint. Though higher than that of FRANK, PW latency is small (<50 μs) which is comparable to anticipated slot times for NR. Consequently, the latency for code construction may be hidden in the previous block decoding period.

Finite precision effects with PW construction are negligible (>75 dB below the signal of interest) suggesting online computation is feasible even for modest bit-widths. In contrast, finite precision requirements with FRANK may benefit from careful treatment to ensure that encoder and decoder arrive at the same K-distribution of bits. This is especially true for long block sizes and low code rates, where $R^M$ terms begin to dominate.

Given the potential for online computation, the K-distribution for enhanced PW may be tuned to approximate that for FRANK providing a similar starting point for rate matching considerations, but without the limitation of the finite precision effects of FRANK.

Enhanced PW: Numerical Example

The following list describes numerical results with β-expansion used in implementing enhanced PW for the particular case of, N=16, m=4, $$\beta_j = 2^{j\frac{1}{4}},$$

assuming transmission over additive Gaussian white noise (AWGN).

Polarization Weights:

$w_0^{15}$=[0 1.0000 1.1892 2.1892 1.4142 2.4142 2.6034 3.6034 1.6818 2.6818 2.8710 3.8710 3.0960 4.0960 4.2852 5.2852].

Ordered Sequence:

$q_0^{15}$=[0 1 2 4 8 3 5 6 9 10 12 7 11 13 14 15].

The following sample channel assignment results for K=6 assuming an all-zero frozen bit field:

$u_0^{15}$=[0 0 0 0 0 0 0 0 $u_0$ $u_2$ 0 $u_1$ $u_3$ $u_4$ $u_5$].

FIG. 11: Nested β-expansion, N=512 (n=9), m=4

Figure 12:
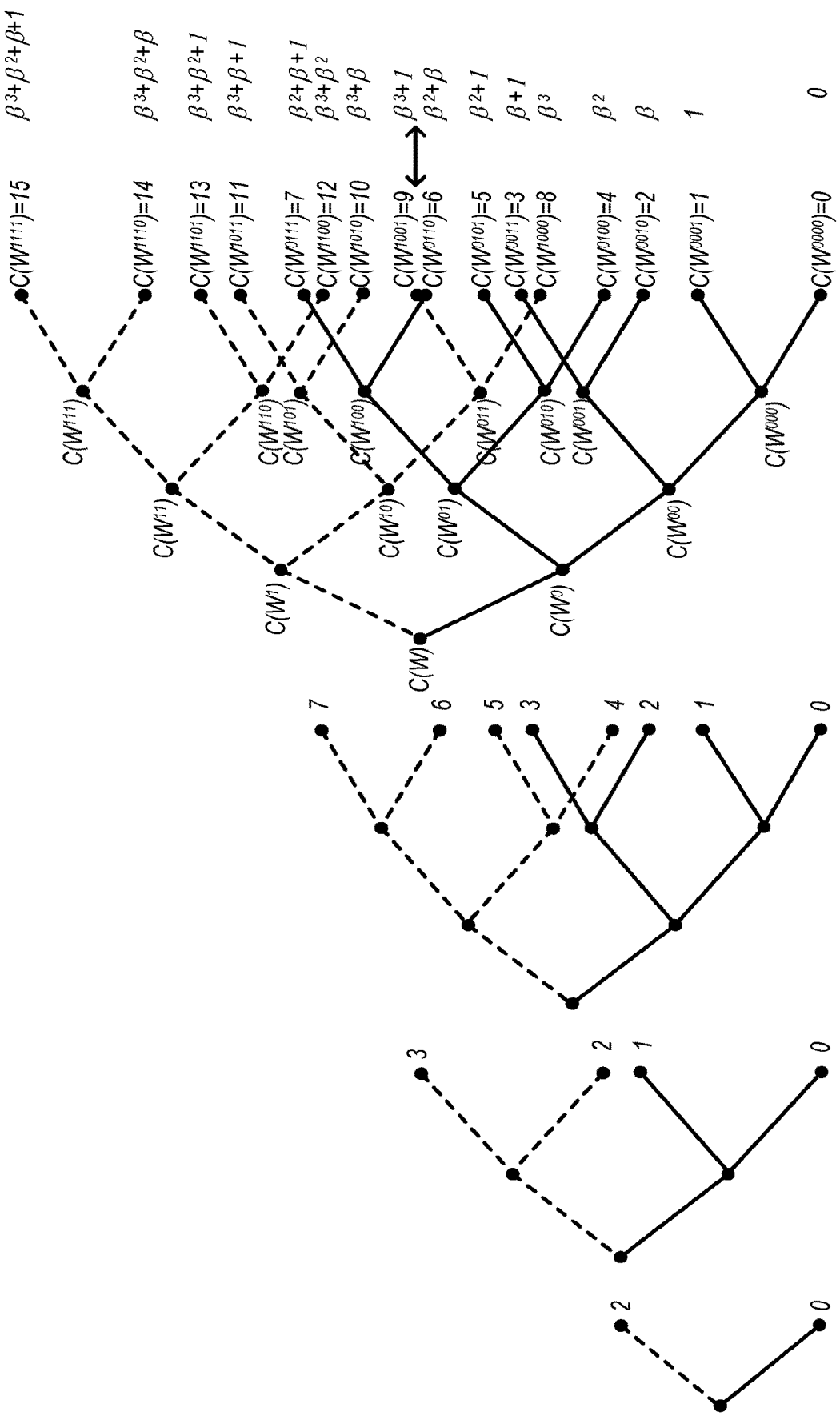
FIG. 12 is a graph of a 4-bit nested $\beta$-expansion, according to some embodiments.

FIG. 12 is a tree diagram illustrating an ordered sequence of terms in β-expansion for a particular value of m. Note that the ordered sequence may be tuned by altering β (i.e., by altering m) to resemble the UPO reliabilities.

Figure 13:
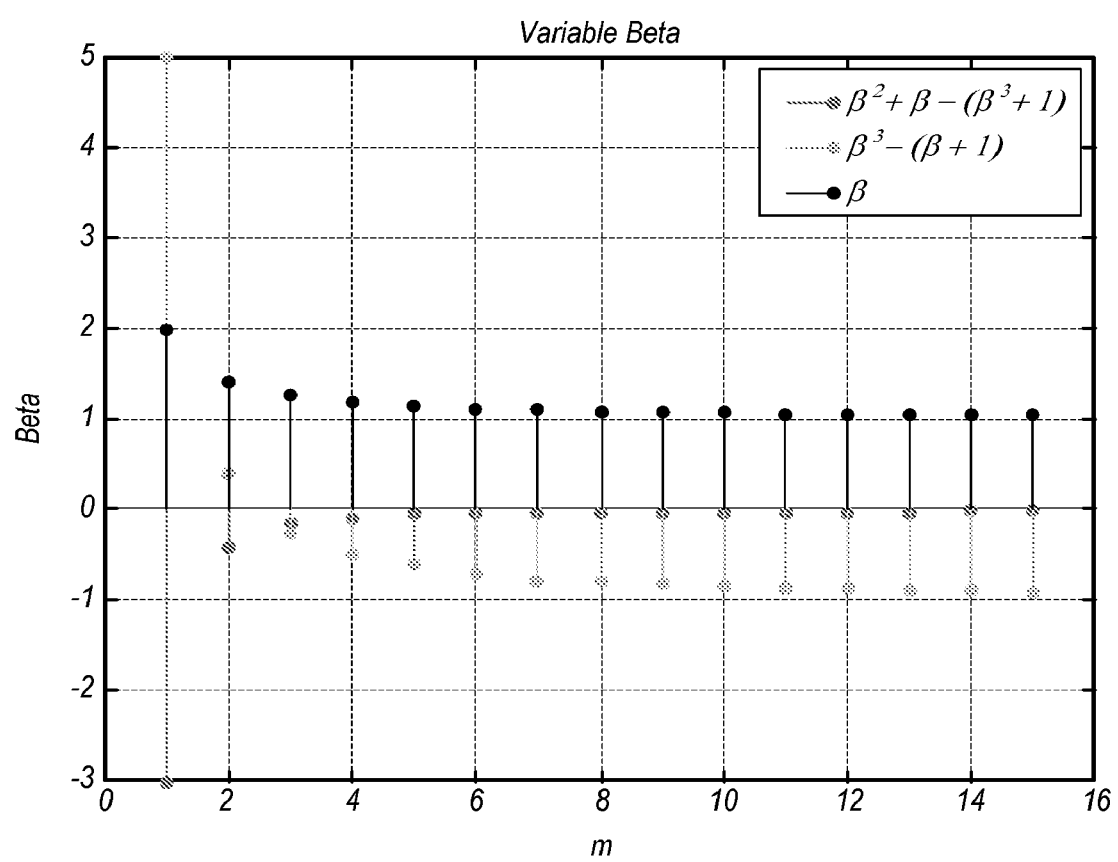
FIG. 13 is a graph of how different terms in a $\beta$-expansion vary as a function of m, according to some embodiments.

The UPO with regard to channel reliabilities is preserved provided certain conditions are met. For example:

$C(W^{0011}) > C(W^{1000}) \beta+1 > \beta^3$; equivalently $\beta^3 - (\beta+1) < 0$ $C(W^{1001}) > C(W^{0110}) \beta^3+1 > \beta^2+\beta$; equivalently $\beta^2 +- (\beta^3+1) < 0$ For example, FIG. 13 illustrates where one or more of these basic conditions is not met for m<2.5. The chosen value of m may be governed by other considerations including the distribution of information bits to lower K-positions as well as the resulting error performance.

FIG. 12: β-expansion, N=512 (n=9), m=4

FRANK prescribes a recursive procedure for distributing information bits according to the assigned code rate such that:

The proportion of information bits allocated to the $W^0$ channel instances: K0=R0/R*K/2.

The proportion of information bits allocated to the $W^1$ channel instances: K1=R1/R*K/2.

The code rate reflects the average $W^1$ and $W^0$ mutual information, respectively: R=(R0+R1)/2.

Carried out in multiple stages, FRANK aims to break the bit assignments into fixed-length sub-blocks. Using FIG. 15 as an example, lower K-positions may be defined as those having a lower index in a given stage. Given this definition, K000 represents a lower K-position as compared to K001, K000-K001 occupy lower K-positions than do K010-K011, and so on.

The approach may result in information bit distribution to lower K-positions in proportion to the intended code rate. The higher the code rate, the greater the number of information bits allocated to lower K-positions. By comparison the PW bit distribution is relatively flat in the lower K-positions as a function of code rate (See Reference 4). For example, see K011[192, 255], highlighted in bold in Table 2 below.

TABLE 2

K distribution of N = 512 PDCCH codes

| | FRANK | | | | | PW: β = 2^¼ | | | | |
|---|---|---|---|---|---|---|---|---|---|---|
| | K = 32 | K = 48 | K = 64 | K = 80 | K = 96 | K = 32 | K = 48 | K = 64 | K = 80 | K = 96 |
| R = K/N | 0.0625 | 0.0938 | 0.125 | 0.1563 | 0.1875 | 0.0625 | 0.0938 | 0.125 | 0.1563 | 0.1875 |
| K000[0, 63] | 0 | 0 | 0 | 0 | 0 | 0 | 0 | 0 | 0 | 0 |
| K001[64, 127] | 0 | 0 | 0 | 0 | 0 | 0 | 0 | 0 | 0 | 0 |
| K010[127, 191] | 0 | 0 | 0 | 0 | 0 | 0 | 0 | 0 | 0 | 0 |
| K011[192, 255] | 1 | 2 | 4 | 6 | 9 | 0 | 0 | 0 | 0 | 1 |
| K100[256, 319] | 0 | 0 | 0 | 0 | 1 | 0 | 0 | 1 | 1 | 4 |
| K101[320, 383] | 2 | 4 | 7 | 10 | 14 | 0 | 1 | 6 | 7 | 12 |
| K110[384, 447] | 3 | 7 | 11 | 16 | 20 | 4 | 8 | 15 | 21 | 27 |
| K111[448, 511] | 26 | 35 | 42 | 48 | 52 | 28 | 39 | 42 | 51 | 52 |

Figure 14:
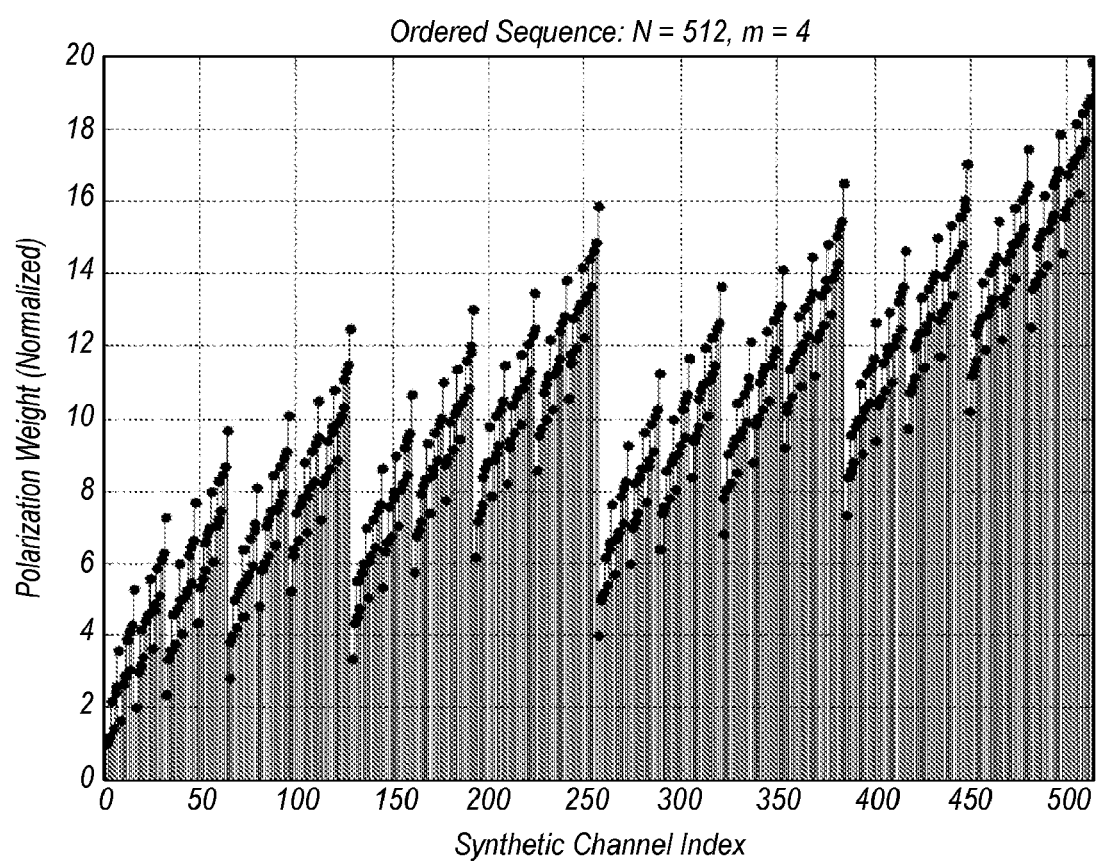
FIG. 14 is a graph of normalized polarization weight as a function of synthetic channel index, according to some embodiments.

FIG. 14 illustrates an example ordered sequence of information bit allocation, $q_0^{N-1}$, for N=512 and m=4. As illustrated, the computed reliabilities generally increase with synthetic channel index, with staggered drops as the index increases.

FIG. 13: Recursive information bit allocation

Figure 15:
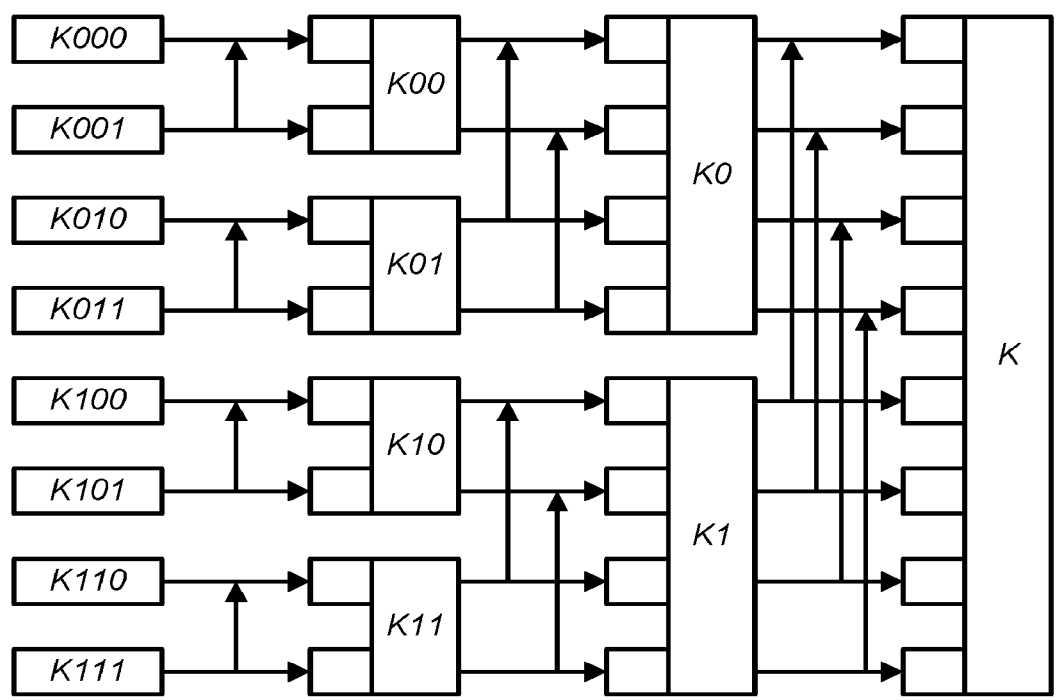
FIG. 15 is a schematic diagram illustrating a method for using FRANK to distribute information bits, according to some embodiments.

FIG. 15 is a schematic diagram illustrating the recursive bit allocation process employed by FRANK. As illustrated, According to embodiments described herein, implementing enhanced PW with variable $\beta=2^{1/m}$ may enable the bit ordering to be tuned to deliver an information bit distribution using the enhanced PW method which approximates that delivered by FRANK. For example, Table 3 illustrates that the allocation of bits in K011[192, 255] was tuned using β-expansion with enhanced PW to match that delivered by FRANK.

TABLE 3

K distribution with variable β

| | FRANK | | | | | enhanced PW: β = 2^(1/m) | | | | |
|---|---|---|---|---|---|---|---|---|---|---|
| | | | | | | K = 32 | K = 48 | K = 64 | K = 80 | K = 96 |
| | K = 32 | K = 48 | K = 64 | K = 80 | K = 96 | m = 15 | m = 14 | m = 12 | m = 13 | m = 12 |
| R = K/N | 0.0625 | 0.0938 | 0.125 | 0.1563 | 0.1875 | 0.0625 | 0.0938 | 0.125 | 0.1563 | 0.1875 |
| K000[0, 63] | 0 | 0 | 0 | 0 | 0 | 0 | 0 | 0 | 0 | 0 |
| K001[64, 127] | 0 | 0 | 0 | 0 | 0 | 0 | 0 | 0 | 0 | 0 |
| K010[128, 191] | 0 | 0 | 0 | 0 | 0 | 0 | 0 | 1 | 1 | 2 |
| K011[192, 255] | 1 | 2 | 4 | 6 | 9 | 1 | 2 | 4 | 6 | 9 |
| K100[256, 319] | 0 | 0 | 0 | 0 | 1 | 0 | 0 | 2 | 1 | 2 |
| K101[320, 383] | 2 | 4 | 7 | 10 | 14 | 5 | 9 | 15 | 19 | 25 |

TABLE 3-continued

K distribution with variable β

|  | FRANK | | | | | enhanced PW: $\beta = 2^{1/m}$ | | | | |
|  | K = 32 | K = 48 | K = 64 | K = 80 | K = 96 | K = 32 m = 15 | K = 48 m = 14 | K = 64 m = 12 | K = 80 m = 13 | K = 96 m = 12 |
|---|---|---|---|---|---|---|---|---|---|---|
| K110[384, 447] | 3 | 7 | 11 | 16 | 20 | 0 | 1 | 5 | 9 | 13 |
| K111[448, 511] | 26 | 35 | 42 | 48 | 52 | 26 | 36 | 37 | 44 | 45 |

FIG. 14: Permutation in Bit Position

FIG. 16 is a scatterplot diagram of information bit allocation using enhanced PW for various values of m. The ordered sequence may be interpreted as the result of a permutation, translating input indices to assigned bit positions. Conventional binary expansion corresponds to m=1, i.e. $\beta=2^{1/1}=2$, yielding the same ordering as the input sequence indexing without permutation (the diagonal line in FIG. 16). The permutation shows greater variability in information bit allocation with increasing values of m (i.e. decreasing β). In other words, increasing m above m=1 leads to information bit allocation that deviates more dramatically from the diagonal line shown in FIG. 16.

Note that with decreasing 13 (i.e. increasing m), the information bit assignments explore the lower K-positions earlier in bit index, starting from index N=512 and proceeding downward. Greater variability in channel permutation may result in distributing information bits more widely in bit-position, more closely resembling the average mutual information for a given code rate.

FIGS. 15a-17b: Bit Distribution

Figure 17B:
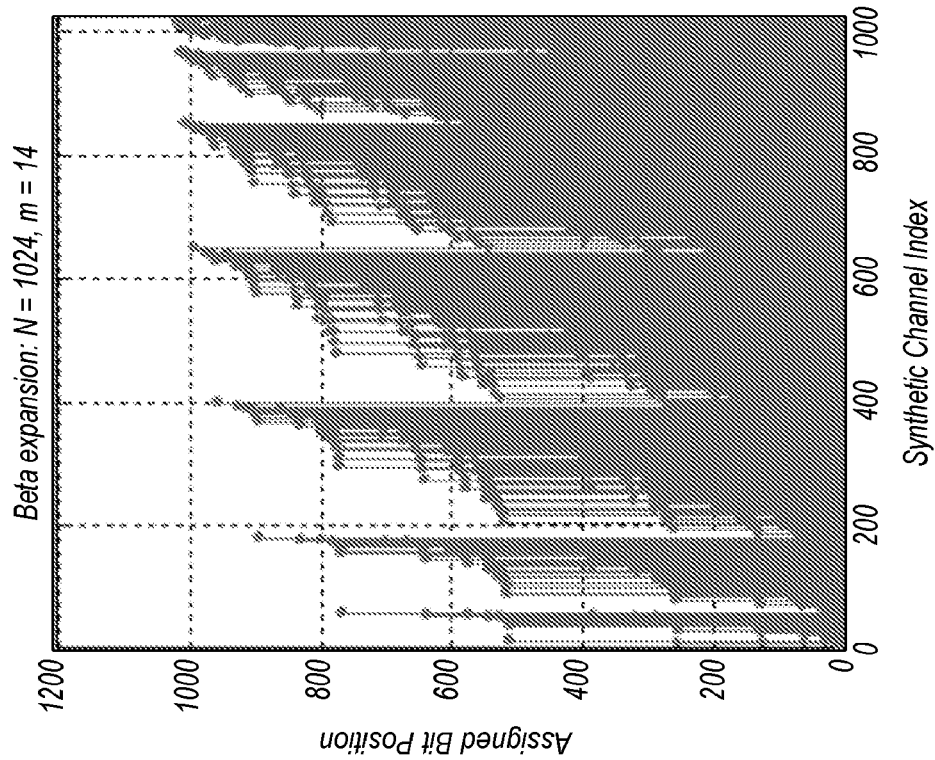
FIGS. 17a and 17b are scatter plots of assigned bit position as a function of synthetic channel index for two values of m, according to some embodiments.
Figure 17A:
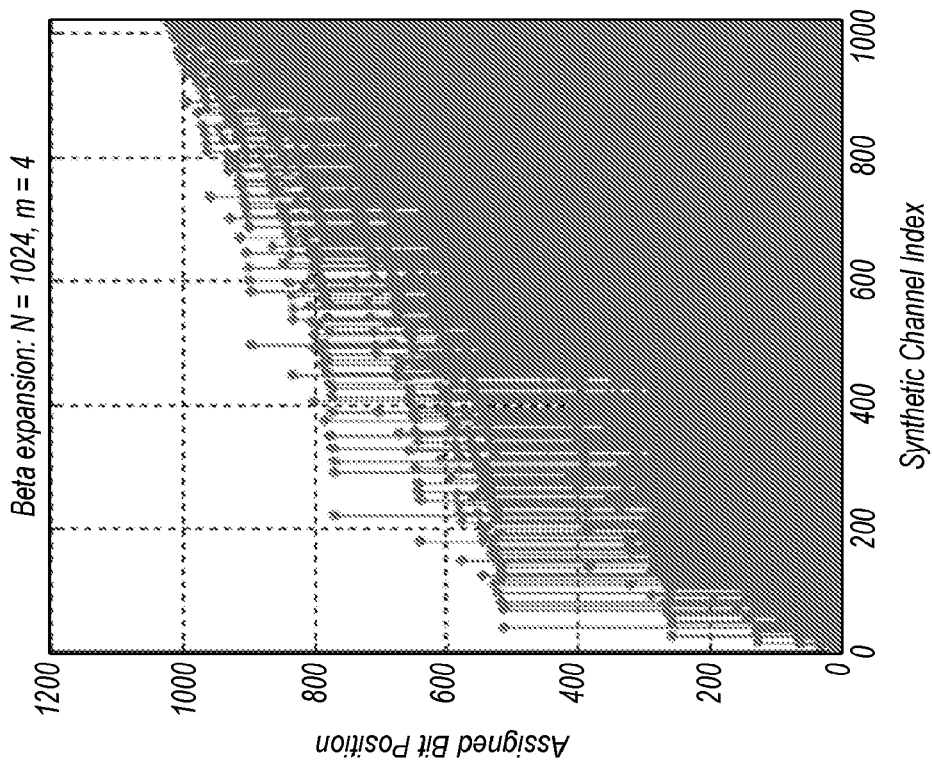

FIGS. 17a-17b illustrate a side-by-side comparison of the ordered sequence of information bit allocation, $q_0^{N-1}$, for N=512 and m=4 (left) and m=14 (right). With increasing values of m (i.e. decreasing A, the resulting channel assignments show considerably more whitespace at higher channel indices, indicating a more widespread distribution of information bits to the lower K-positions. For example, the larger value of m=14 is shown to result in considerably more "whitespace", indicating a broader (i.e., less monotonic) distribution of information bit allocation. FIGS. 17a-17b illustrate how larger values of m may lead to information bit allocation earlier in the polar code, which may more accurately approximate the exact channel reliabilities depending on the values of the block size and the coding rate.

Channel Ordering

An important measure of code performance is how well the channel assignments conform to the computed channel reliabilities, listed as "IDX" in FIG. 16 as a function of code rate, R=K/N. The closer the ordered sequence comes in bit index to that indicated by the computed channel reliabilities, the better the code performance.

FIG. 16: Channel Ordering

FIG. 18 illustrates assigned bit position (i.e., information bit allocation) for four different values of the coding rate, K, and for various values of m, as compared to the exact channel reliabilities ("IDX"). There is often considerable mismatch in code assignment as β-expansion (and FRANK for that matter) at best approximates the ordering achieved given the computed channel reliabilities. However, for low code rates, e.g. K=16, it is evident that the error in channel assignment is relatively small independent of the assigned β value. The error rates climb steadily with K. However, multiple crossover points exist where some values in β yield a closer match on average in assigned bit position than others. For example, the average error in asserted channel reliability is illustrated in FIG. 19, where the smallest error indicates the best choice in β for a given block size and code rate.

Table 4, below, lists the values m which yield the smallest average error in assigned channel reliability for various values of code rate and various block sizes. In some embodiments, a revised approach may be implemented whereby m is determined offline based on the value that minimizes the error in channel reliability for a given code rate and block size configuration. β-expansion may then continue at run-time taking $\beta=2^{1/m}$ as an input parameter for the selected code rate and block size configuration.

TABLE 4

β-selection based on minimum channel assignment error

| Code Rate | Beta Selection-yielding the smallest error in assigned channel reliability given $\beta = 2^{1/m}$ | | | | | | |
|---|---|---|---|---|---|---|---|
| 0.0625 | 3 | 6 | 5 | 3 | 3 | 3 | 3 |
| 0.0938 | 3 | 6 | 5 | 11 | 3 | 3 | 3 |
| 0.1250 | 5 | 6 | 5 | 11 | 3 | 3 | 3 |
| 0.1563 | 5 | 6 | 5 | 14 | 6 | 3 | 3 |
| 0.1875 | 3 | 8 | 7 | 14 | 9 | 3 | 16 |
| 0.2188 | 3 | 8 | 6 | 8 | 9 | 3 | 16 |
| 0.2500 | 3 | 7 | 5 | 8 | 9 | 3 | 16 |
| 0.2813 | 12 | 7 | 7 | 8 | 9 | 4 | 16 |
| 0.3125 | 12 | 7 | 7 | 8 | 5 | 4 | 15 |
| 0.3438 | 12 | 8 | 7 | 8 | 5 | 4 | 15 |
| 0.3750 | 6 | 8 | 7 | 8 | 5 | 4 | 15 |
| 0.4063 | 6 | 7 | 6 | 8 | 5 | 4 | 15 |
| 0.4375 | 6 | 7 | 6 | 8 | 3 | 4 | 15 |
| 0.4688 | 6 | 7 | 6 | 11 | 5 | 3 | 15 |
| 0.5000 | 6 | 7 | 6 | 10 | 3 | 3 | 12 |
| 0.5313 | 6 | 3 | 6 | 10 | 3 | 3 | 12 |
| 0.5625 | 6 | 3 | 6 | 10 | 3 | 3 | 12 |
| 0.5938 | 6 | 3 | 6 | 10 | 3 | 3 | 12 |
| 0.6250 | 6 | 3 | 6 | 10 | 3 | 3 | 12 |
| 0.6563 | 6 | 3 | 6 | 11 | 3 | 3 | 12 |
| 0.6875 | 6 | 3 | 6 | 11 | 3 | 3 | 12 |
| 0.7188 | 6 | 3 | 6 | 10 | 3 | 3 | 12 |
| 0.7500 | 6 | 3 | 6 | 11 | 3 | 3 | 12 |
| 0.7813 | 6 | 3 | 6 | 10 | 3 | 3 | 12 |
| 0.8125 | 6 | 7 | 6 | 10 | 3 | 3 | 12 |
| 0.8438 | 6 | 3 | 6 | 10 | 3 | 3 | 12 |
| 0.8750 | 6 | 7 | 6 | 10 | 3 | 3 | 12 |
| n | 6 | 7 | 8 | 9 | 10 | 11 | 12 | Block |
| N | 64 | 128 | 256 | 512 | 1024 | 2048 | 4096 | Size |

Modified β-Expansion Procedure

In some embodiments, a modified β-expansion procedure may be performed as follows:

i. Take $B_i \triangleq b_{n-1}b_{n-2}\ldots b_0$ as the binary expansion of the synthetic channel index, i=0, 1, ..., N−1, where $b_j \in \{0,1\}$, j=[0,1, ..., n−1], ii. Take as input the parameter, m, seen to minimize the error in channel reliability assignment for a given combination in code rate and block size.

iii. Compute the polarization weights, $$w_i = \sum_{j=0}^{n-1} b_j \cdot \beta_j,$$

where $\beta_j = 2^{j\frac{1}{m}}$ where the integer value, m>0, determines the rate of expansion, i.e. $w_i = b_{n-1} \cdot 2^{\frac{n-1}{m}} + b_{n-2} \cdot 2^{\frac{n-2}{m}} + \ldots + b_0 \cdot 2^{\frac{0}{m}}.$ iv. Sort such that $w_{Q_0} \leq w_{Q_1} \leq w_{Q_2} \leq \ldots \leq w_{Q_{N-1}}$ then save the resulting indices as the ordered sequence, $q_0^{N-1}$.

Inserted in step-ii, the selection of m may involve offline computation to determine a desirable value of m for the assigned code rate/block size combination. Online computation may proceed thereafter given the selected value $\beta=2^{1/m}$. This modified approach may preserve the computational efficiency of β-expansion in assessing channel reliabilities at run-time while incorporating a means to tune the bit assignments for a better match in channel reliability as a function of code rate.

Embodiments of the present disclosure may be realized in any of various forms. For example, in some embodiments, the present invention may be realized as a computer-implemented method, a computer-readable memory medium, or a computer system. In other embodiments, the present invention may be realized using one or more custom-designed hardware devices such as ASICs. In other embodiments, the present invention may be realized using one or more programmable hardware elements such as FPGAs.

In some embodiments, a non-transitory computer-readable memory medium may be configured so that it stores program instructions and/or data, where the program instructions, if executed by a computer system, cause the computer system to perform a method, e.g., any of the method embodiments described herein, or, any combination of the method embodiments described herein, or, any subset of any of the method embodiments described herein, or, any combination of such subsets.

In some embodiments, a computing device may be configured to include a processor (or a set of processors) and a memory medium, where the memory medium stores program instructions, where the processor is configured to read and execute the program instructions from the memory medium, where the program instructions are executable to implement any of the various method embodiments described herein (or, any combination of the method embodiments described herein, or, any subset of any of the method embodiments described herein, or, any combination of such subsets). The device may be realized in any of various forms.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method for transmitting polar encoded data, the method comprising:
    storing data to be polar encoded;
    determining a reliability associated with each bit position in a bit sequence by:
        calculating a sequence of weighted summations corresponding to each of the bit positions, wherein the reliability of each bit position is determined from its respective weighted summation, wherein the weighted summations are calculated according to the expression $w_i = \sum_{j=0}^{n-1} b_j \cdot \beta_j$, wherein $w_i$ is the weighted summation for the $i^{th}$ bit position, wherein j is a summation index, wherein n is a total number of bit positions in the bit sequence, wherein $b_j$ are elements of a binary expansion over a respective bit position, wherein $$\beta_j = 2^{j\frac{1}{m}},$$

and wherein m is a numerical value different from 4;
    rank ordering the bit positions based on their respective reliabilities;
    allocating the data as information bits in the most reliable bit positions of a polar code based on the rank ordering;
    allocating the remaining portion of bit positions as frozen bits of the polar code;
    polar encoding the information bits and the frozen bits; and
    transmitting the polar encoded information bits and frozen bits.

2. The method of claim 1, the method further comprising:
    determining a coding rate for polar encoding the data, wherein m is selected based at least in part on the coding rate.

3. The method of claim 1,
    wherein m comprises an adjustable parameter that is tunable based at least in part on the block size.

4. The method of claim 3,
    wherein m is selected to spread a distribution of the information bits of the polar code to earlier bit positions relative to a distribution obtained from selecting m=4.

5. The method of claim 1, wherein m is selected such that the polar code approximates a corresponding polar code, wherein the corresponding polar code implements a coding rate associated with the polar encoding and is constructed using an alternative polar code construction methodology.

6. The method of claim 5,
    wherein the polar code is constructed according to an enhanced polarization weighting methodology, and wherein the alternative polar code construction methodology comprises a fractally enhanced kernel (FRANK) polar code construction methodology.

7. The method of claim 1, the method further comprising:
storing second data to be polar encoded;
determining a second coding rate for polar encoding the second data;
determining a second reliability associated with each bit position in the bit sequence by:
calculating a second sequence of second weighted summations corresponding to each of the bit positions, wherein the second reliability of each bit position is determined from its respective second weighted summation, wherein the second weighted summations are calculated according to the expression $w_{2,i}=\Sigma_{k=0}^{n-1} b_k \cdot \beta_{2,k}$, wherein $w_{2,i}$ is the weighted summation for the $i^{th}$ bit position, wherein k is a summation index, wherein $b_k$ are elements of a binary expansion over a respective bit position, wherein $$\beta_{2,k} = 2^{k \cdot \frac{1}{p}},$$

and wherein p is a numerical value different from 4, and wherein p is different from m;
performing second rank ordering of the bit positions based on their respective second reliabilities;
allocating the second data as second information bits in the most reliable bit positions of a second polar code based on the second rank ordering;
allocating the remaining portion of bit positions as second frozen bits of the second polar code;
polar encoding the second information bits and the second frozen bits; and
transmitting the polar encoded second information bits and second frozen bits.

8. A user equipment device (UE), comprising:
a radio;
a memory; and
one or more processing elements operably coupled to the radio and the memory;
wherein the radio, the memory, and the one or more processing elements are configured to:
store data to be polar encoded in the memory;
determine a reliability associated with each bit position in a bit sequence, wherein the reliability of each respective bit position is determined by computing a weighted sum over a binary expansion of the respective bit position, wherein the reliability of each bit position is determined from its respective weighted summation, wherein the weighted summations are calculated according to the expression $w_i=\Sigma_{j=0}^{n-1} b_j \cdot \beta_j$, wherein $w_i$ is the weighted summation for the $i^{th}$ bit position, wherein j is a summation index, wherein n is a total number of bit positions in the bit sequence, wherein $b_j$ are elements of a binary expansion over a respective bit position, wherein $$\beta_j = 2^{j \cdot \frac{1}{m}},$$

and wherein m is a numerical value different from 4;
rank order the bit positions based on their respective reliabilities; and
allocate the data as information bits in the most reliable bit positions of a polar code based on the rank ordering;
allocate the remaining portion of bit positions as frozen bits of the polar code;
polar encode the information bits and the frozen bits; and
transmit, via the radio, the polar encoded information bits and frozen bits.

9. The UE of claim 8, wherein the radio, the memory, and the one or more processing elements are further configured to:
determine a coding rate associated with the polar encoding, wherein the sum is weighted further based at least in part on the coding rate.

10. The UE of claim 8,
wherein m comprises an adjustable parameter that is tunable based at least in part on a block size of the polar code.

11. The UE of claim 8,
wherein m comprises an adjustable parameter that is tunable based at least in part on a coding rate associated with the polar encoding.

12. The UE of claim 8,
wherein m is selected to spread a distribution of the information bits of the polar code to earlier bit positions relative to a distribution obtained from selecting m=4.

13. The UE of claim 8, wherein m is selected such that the polar code approximates a corresponding polar code, wherein the corresponding polar code implements a coding rate associated with the polar encoding and is constructed using an alternative polar code construction methodology.

14. The UE of claim 13,
wherein the polar code is constructed according to an enhanced polarization weighting methodology, and wherein the alternative polar code construction methodology comprises a fractally enhanced kernel (FRANK) polar code construction methodology.

15. An apparatus, comprising:
one or more processing elements configured to cause a wireless device to:
store data to be polar encoded;
determine a reliability associated with each bit position in a bit sequence, wherein in determining the reliability associated with each bit position in the bit sequence, the processing element is configured to:
calculate a sequence of weighted summations corresponding to each of the bit positions, wherein the reliability of each bit position is determined from its respective weighted summation, wherein the weighted summations are calculated according to the expression $w_i=\Sigma_{j=0}^{n-1} b_j \cdot \beta_j$, wherein $w_i$ is the weighted summation for the $i^{th}$ bit position, wherein j is a summation index, wherein n is a total number of bit positions in the bit sequence, wherein $b_j$ are elements of a binary expansion over a respective bit position, wherein $$\beta_j = 2^{j \cdot \frac{1}{m}},$$

and wherein m is a numerical value different from 4;
rank order the bit positions based on their respective reliabilities;

allocate the data as information bits in the most reliable bit positions of a polar code based on the rank ordering;

allocate the remaining portion of bit positions as frozen bits of the polar code;

polar encode the information bits and the frozen bits; and transmit the polar encoded information bits and frozen bits.

16. The apparatus of claim 15, wherein the one or more processing elements are further configured to cause the wireless device to:

determine a coding rate for polar encoding the data, wherein m is selected based at least in part on the coding rate.

17. The apparatus of claim 15, wherein m comprises an adjustable parameter that is tunable based at least in part on the coding rate.

18. The apparatus of claim 15, wherein m is selected to spread a distribution of the information bits of the polar code to earlier bit positions relative to a distribution obtained from selecting m=4.

19. The apparatus of claim 15, wherein m is selected such that the polar code approximates a corresponding polar code, wherein the corresponding polar code implements a coding rate associated with the polar encoding and is constructed using an alternative polar code construction methodology.

20. The apparatus of claim 19, wherein the polar code is constructed according to an enhanced polarization weighting methodology, and wherein the alternative polar code construction methodology comprises a fractally enhanced kernel (FRANK) polar code construction methodology.

* * * * *